US008415885B2

(12) United States Patent
Yamazawa

(10) Patent No.: US 8,415,885 B2
(45) Date of Patent: Apr. 9, 2013

(54) PLASMA PROCESSING APPARATUS AND PLASMA PROCESSING METHOD

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 177 days.

(21) Appl. No.: 13/051,689

(22) Filed: Mar. 18, 2011

(65) Prior Publication Data

US 2011/0233170 A1    Sep. 29, 2011

Related U.S. Application Data

(60) Provisional application No. 61/331,947, filed on May 6, 2010.

(30) Foreign Application Priority Data

Mar. 18, 2010 (JP) ................................. 2010-062179

(51) Int. Cl.
*H05H 1/24* (2006.01)
*C23C 14/34* (2006.01)
*C23C 16/00* (2006.01)
*H01J 7/24* (2006.01)

(52) U.S. Cl.
USPC ............ 315/111.51; 315/111.21; 315/111.71; 156/345.48; 204/192.1; 204/298.08

(58) Field of Classification Search ............. 315/111.21, 315/111.51, 111.71; 156/345.48; 204/192.1, 204/298.08
See application file for complete search history.

(56) References Cited

U.S. PATENT DOCUMENTS

| 5,401,350 A | 3/1995 | Patrick et al. |
| 5,731,565 A | 3/1998 | Gates |
| 5,907,221 A | 5/1999 | Sato et al. |
| 7,367,281 B2 * | 5/2008 | Lee .................... 118/723 AN |
| 2011/0094996 A1 * | 4/2011 | Yamazawa et al. ............. 216/68 |

* cited by examiner

*Primary Examiner* — Douglas W Owens
*Assistant Examiner* — Thai Pham
(74) *Attorney, Agent, or Firm* — Rothwell, Figg, Ernst & Manbeck, P.C.

(57) ABSTRACT

A plasma processing apparatus includes a vacuum evacuable processing chamber, at least a portion of which is formed of a dielectric window; a substrate supporting unit for supporting a target substrate in the processing chamber; and a processing gas supply unit for supplying a desired processing gas into the processing chamber. Further, the plasma processing apparatus includes an RF antenna provided outside the dielectric window; a high frequency power supply unit for supplying to the RF antenna a high frequency power; and a switching network switched among a parallel mode, a multiplication series mode, and a minimization series mode.

26 Claims, 43 Drawing Sheets

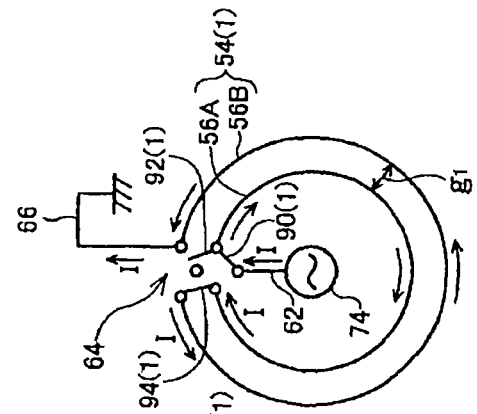
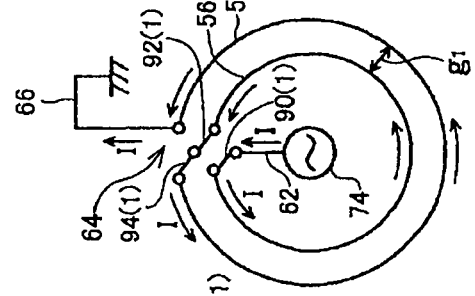
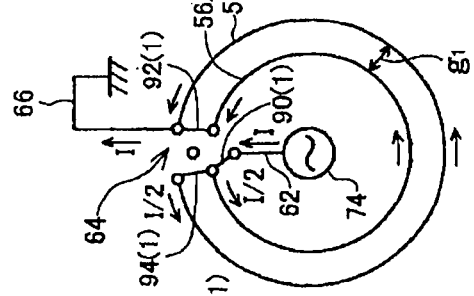
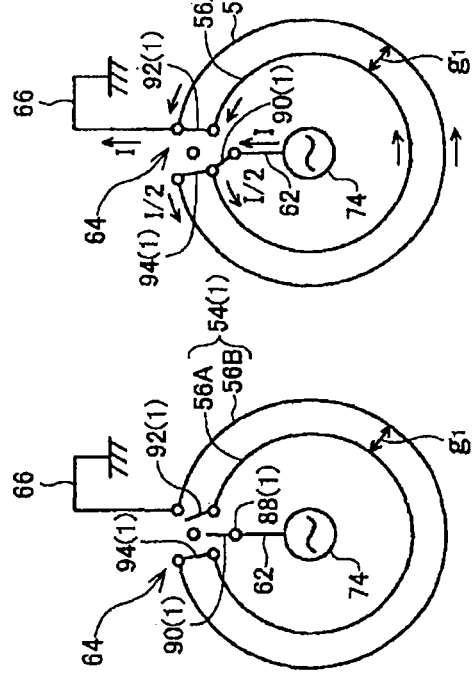

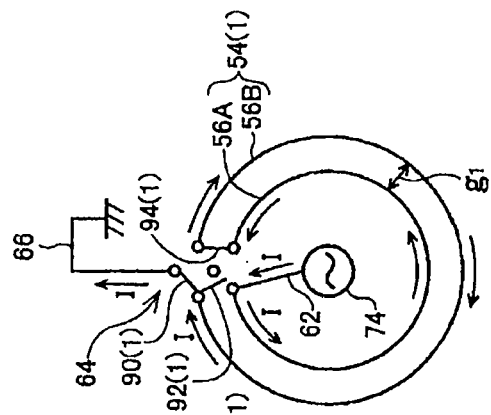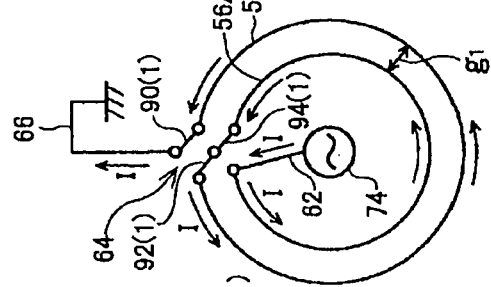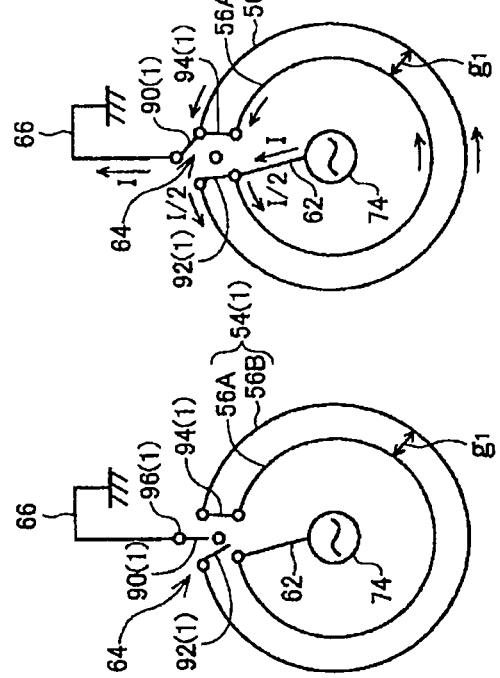

FIG. 6A
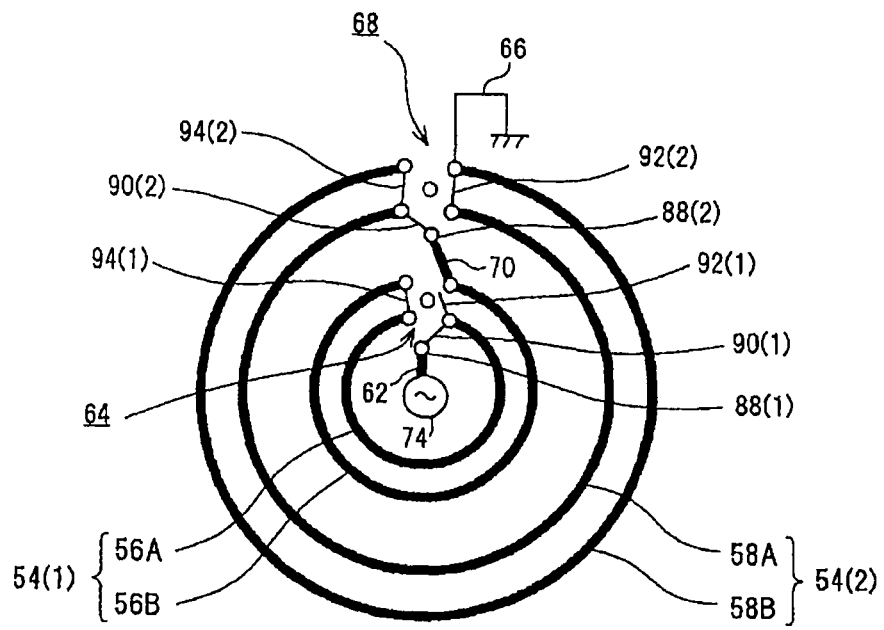
[0AT/1AT]
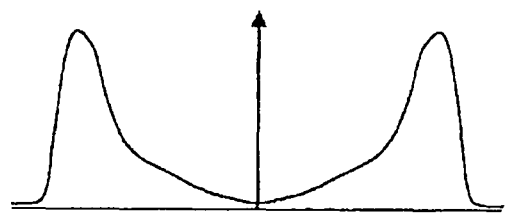
( CURRENT DENSITY DISTRIBUTION IN DOUGHNUT-SHAPED PLASMA )

FIG.6B
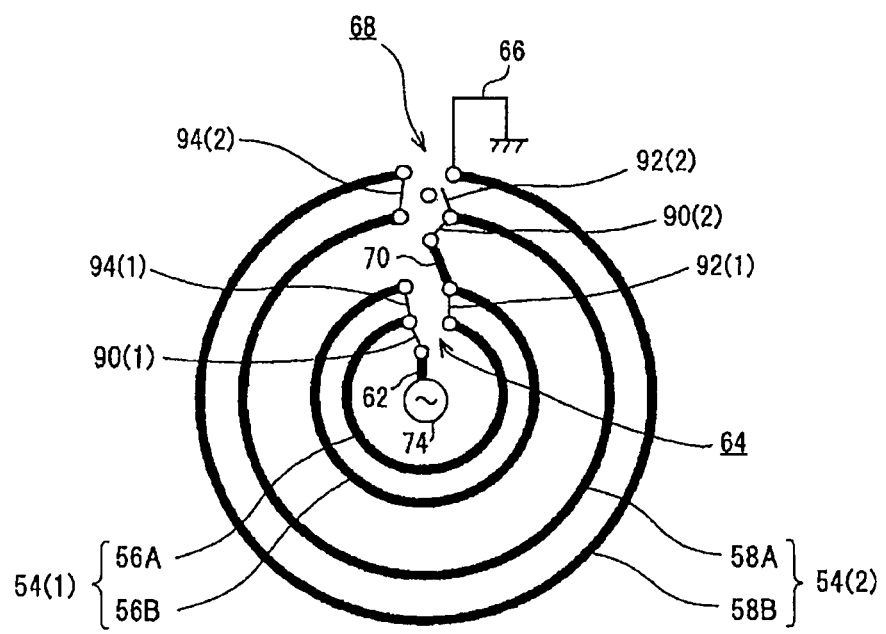
[1AT/0AT]
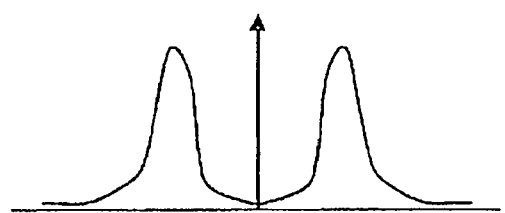
(CURRENT DENSITY DISTRIBUTION IN DOUGHNUT-SHAPED PLASMA)

FIG.6C
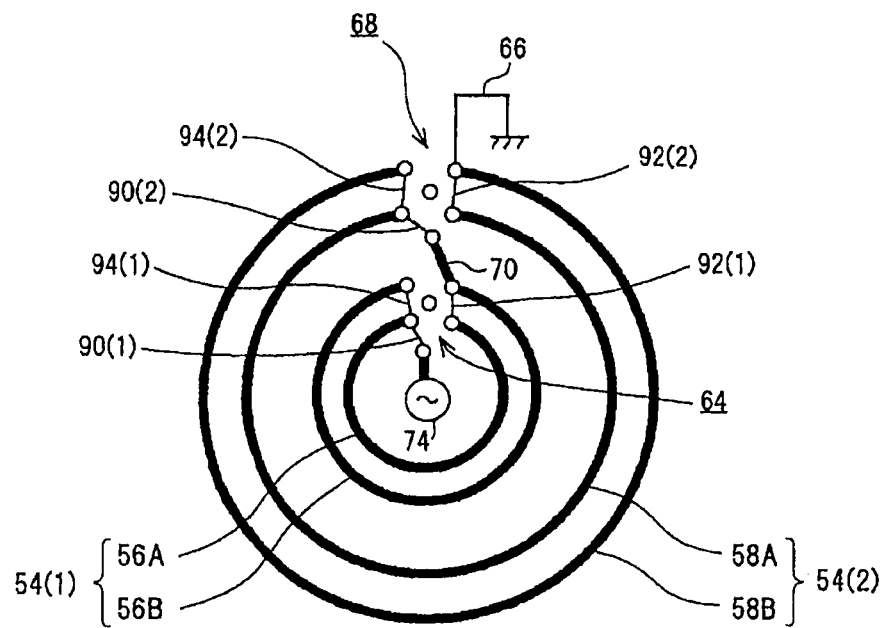
[1AT/1AT]
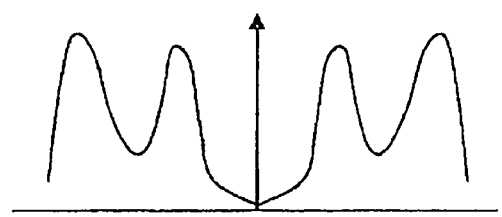
( CURRENT DENSITY DISTRIBUTION IN DOUGHNUT-SHAPED PLASMA )

FIG. 6D
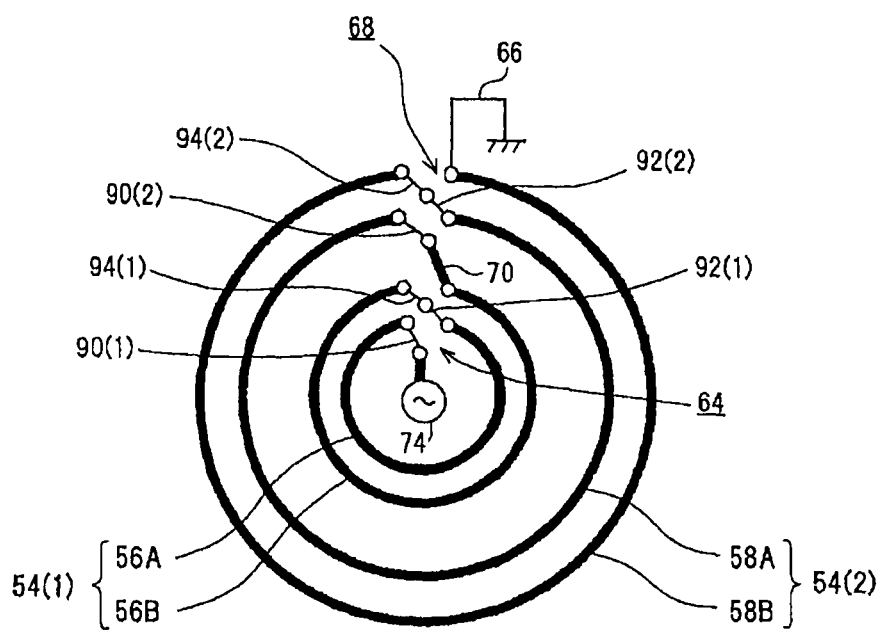
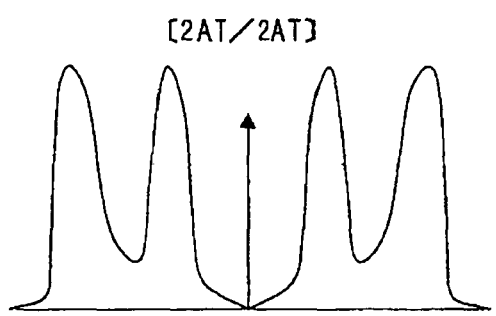
(CURRENT DENSITY DISTRIBUTION IN DOUGHNUT-SHAPED PLASMA)

FIG.6E
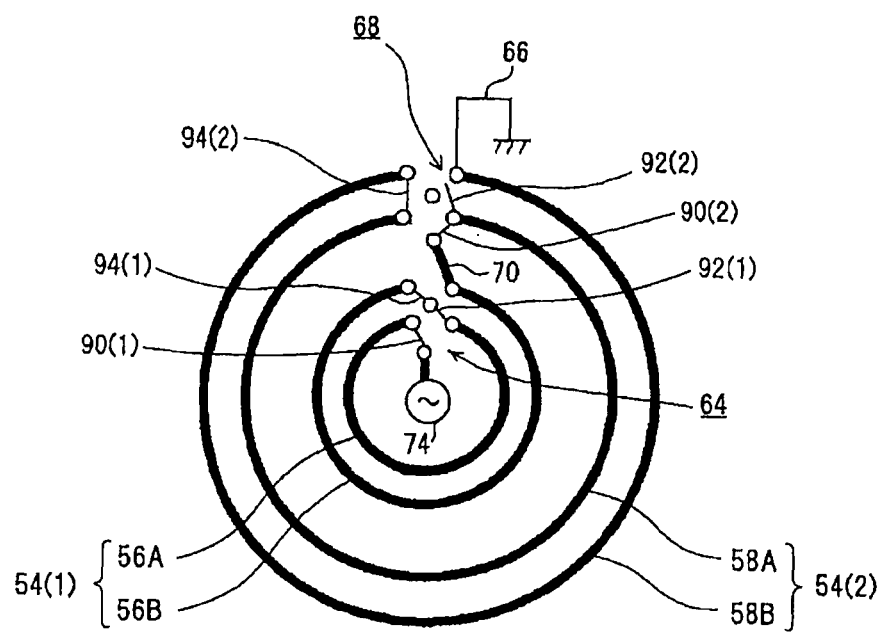
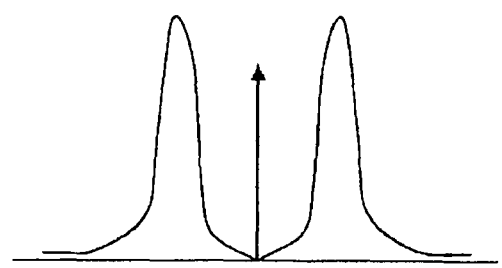
( CURRENT DENSITY DISTRIBUTION IN DOUGHNUT-SHAPED PLASMA )

FIG.6F
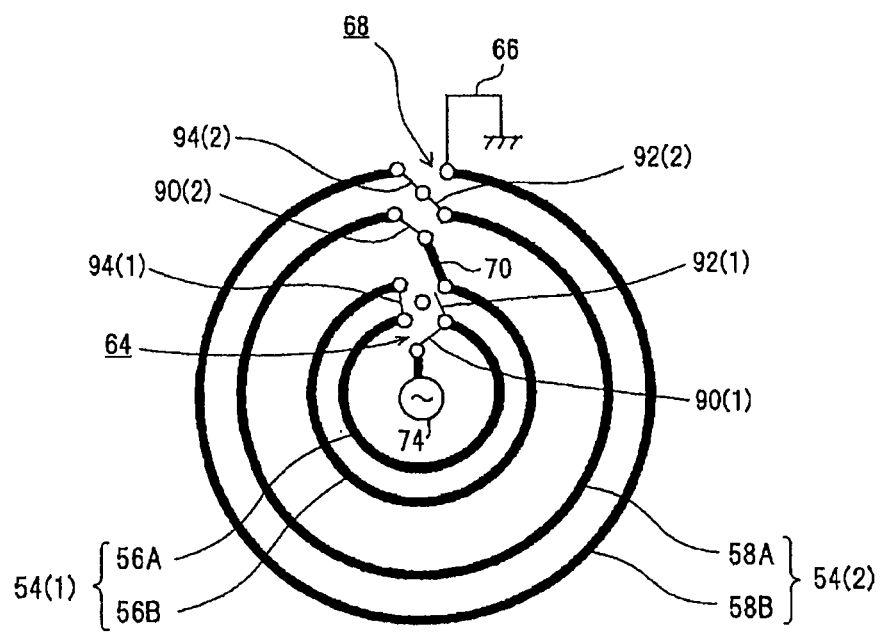
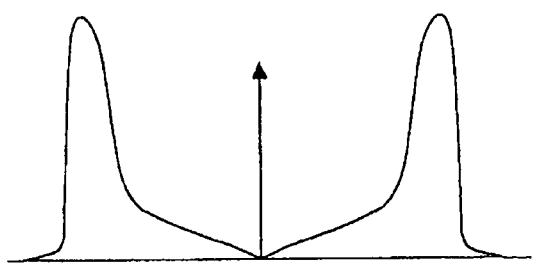
(CURRENT DENSITY DISTRIBUTION IN DOUGHNUT-SHAPED PLASMA)

FIG.6G
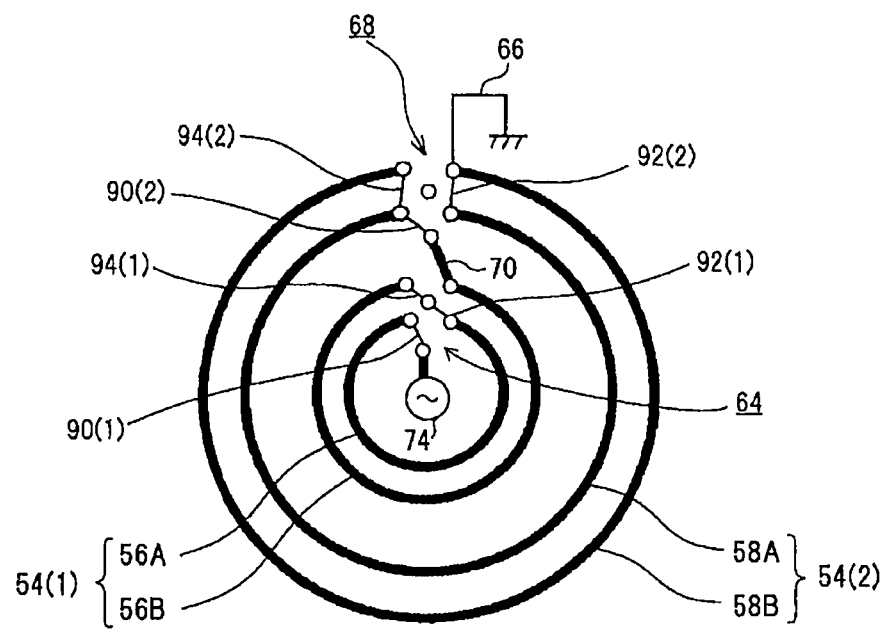
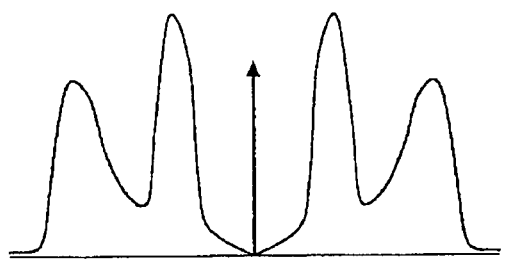
(CURRENT DENSITY DISTRIBUTION IN DOUGHNUT-SHAPED PLASMA)

FIG. 6H
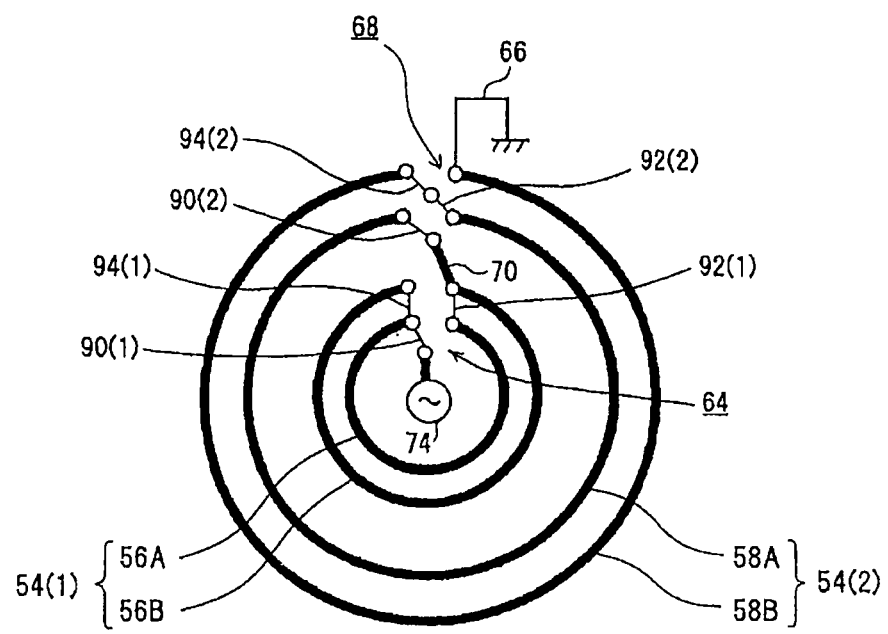
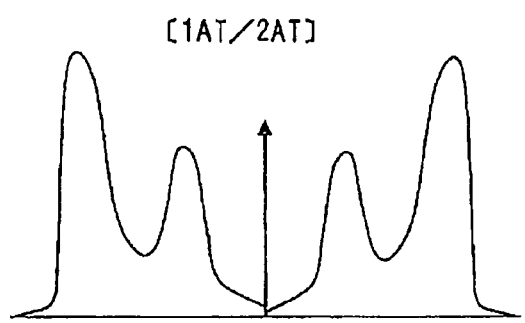
(CURRENT DENSITY DISTRIBUTION IN DOUGHNUT-SHAPED PLASMA)

[2AT/1AT]

[2AT/2AT]

[1AT/2AT]

[1AT/1AT]

[2AT/2AT]

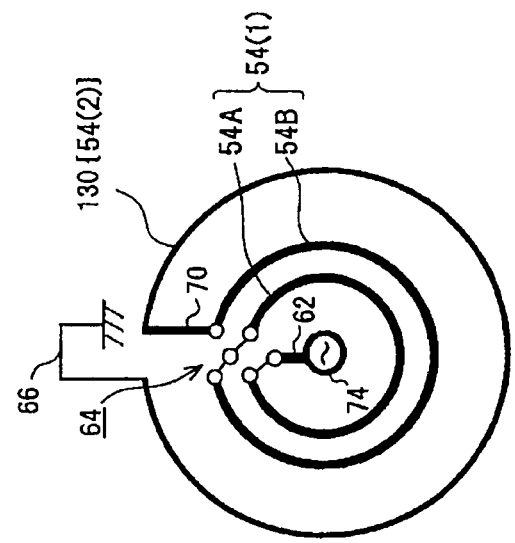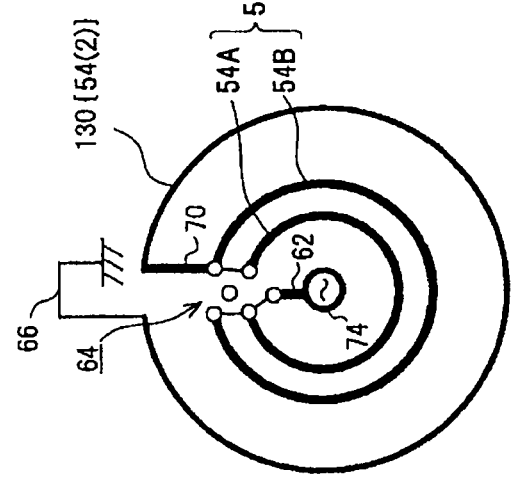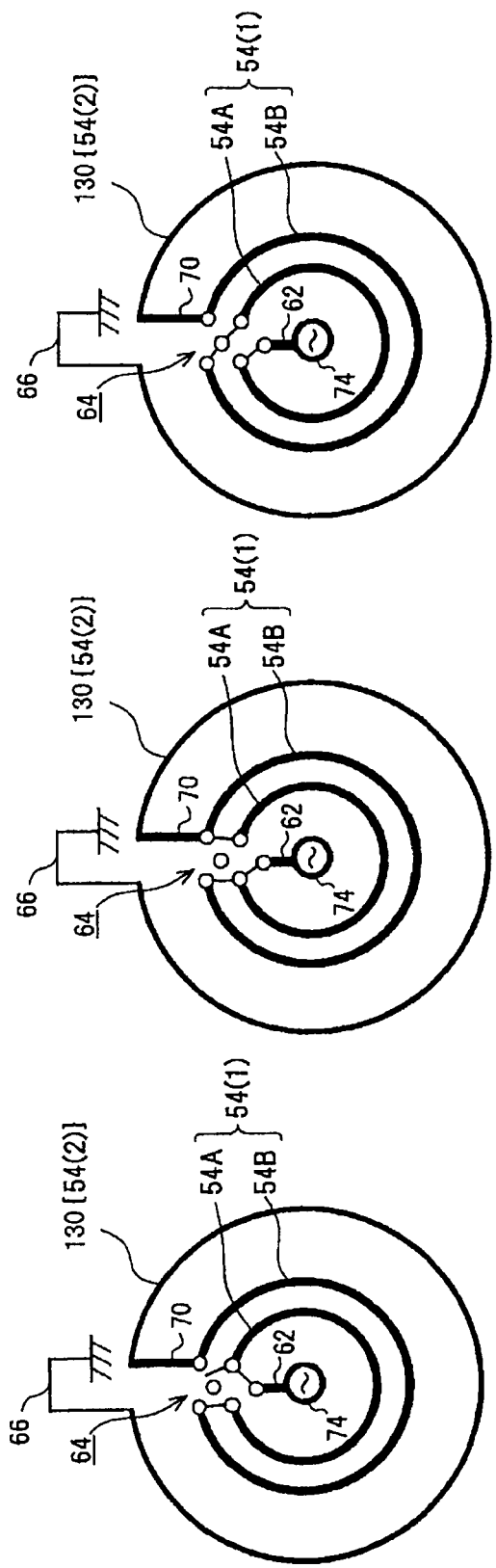

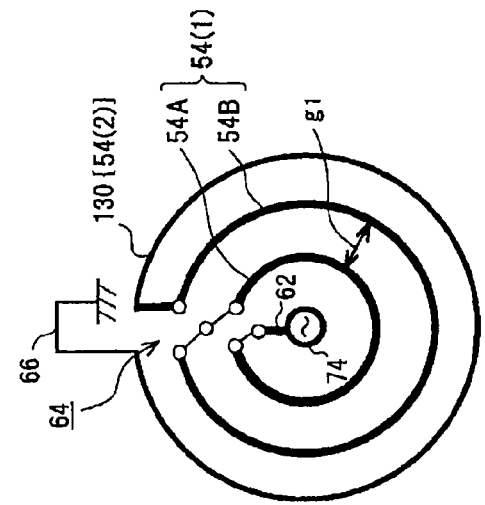 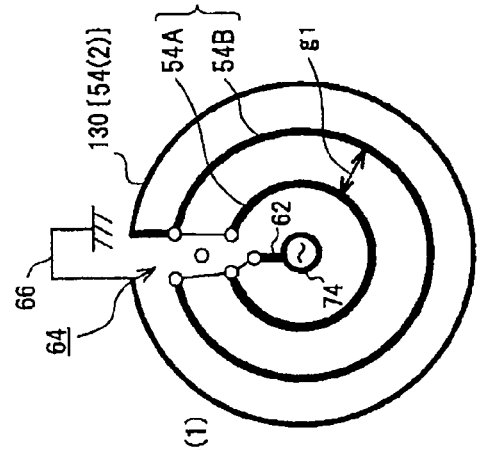 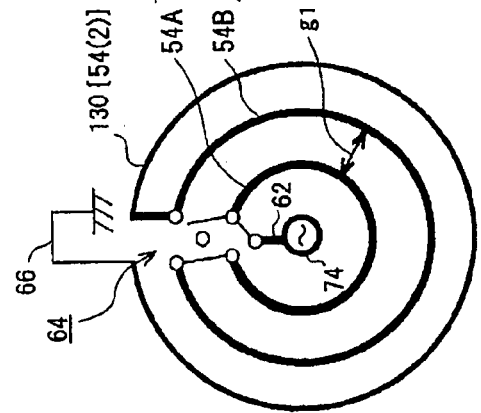
FIG.21A  FIG.21B  FIG.21C
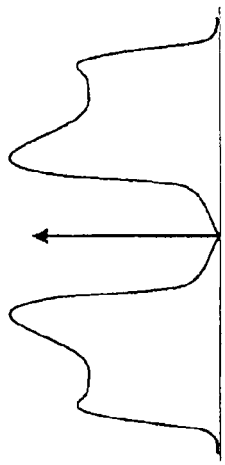 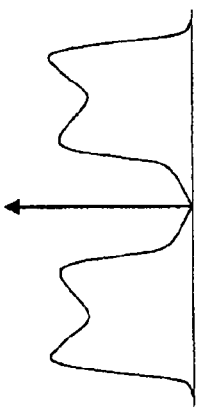 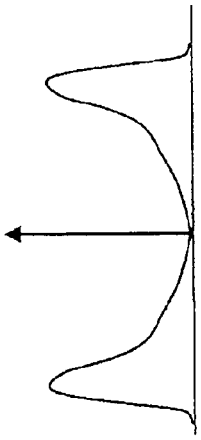
[0AT/1AT]  [1AT/1AT]  [2AT/1AT]

FIG. 22E
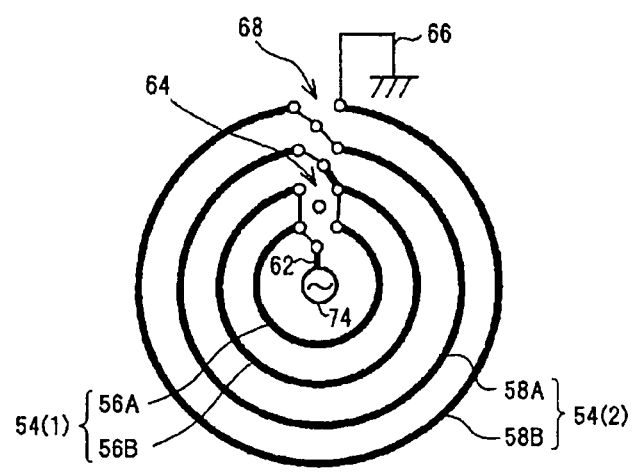
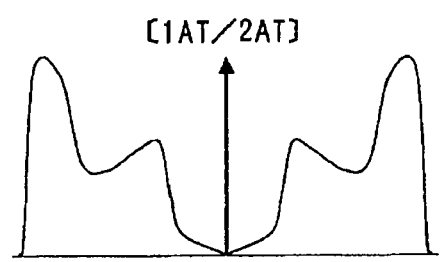

[0AT/1AT]

| SLIT WIDTH |
|---|
| — 0 mm |
| ······ 1 mm |
| ---- 2 mm |
| — 5 mm |

[1AT/1AT]

[2AT/1AT]

PLASMA PROCESSING APPARATUS AND PLASMA PROCESSING METHOD

FIELD OF THE INVENTION

The present invention relates to a technique for performing a plasma process on a target substrate; and, more particularly, to an inductively coupled plasma processing apparatus and a plasma processing method therefor.

BACKGROUND OF THE INVENTION

In a manufacturing process of a semiconductor device or a flat panel display (FPD), a plasma is widely used in a process such as etching, deposition, oxidation, sputtering or the like since it has a good reactivity with a processing gas at a relatively low temperature. In such plasma process, the plasma is mostly generated by a high frequency discharge in the megahertz range. Specifically, the plasma generated by the high frequency discharge is classified into a capacitively coupled plasma and an inductively coupled plasma.

Typically, an inductively coupled plasma processing apparatus includes a processing chamber, at least a portion of wall (e.g., a ceiling portion) of which is formed of a dielectric window; and a coil-shaped RF antenna provided outside the dielectric window, and a high frequency power is supplied to the RF antenna. The processing chamber serves as a vacuum chamber capable of being depressurized, and a target substrate (e.g., a semiconductor wafer, a glass substrate or the like) to be processed is provided at a central portion of the chamber. Further, a processing gas is introduced into a processing space between the dielectric window and the substrate. As a high frequency current flows though the RF antenna, an AC magnetic field is generated around the RF antenna, wherein the magnetic force lines of the AC magnetic field travel through the dielectric window and the processing space in the chamber. The temporal alteration of the generated AC magnetic field causes an electric field to be induced azimuthally. Moreover, electrons azimuthally accelerated by the induced electric field collide with molecules or atoms of the processing gas, to thereby ionize the processing gas and generate a plasma in a doughnut shape.

By increasing the size of the processing space in the chamber, the plasma is efficiently diffused in all directions (especially, in the radical direction), thereby making the density of the plasma on the substrate uniform. However, the uniformity of the plasma density on the substrate that is obtained by merely using a typical RF antenna is generally insufficient for the plasma process. Accordingly, in the plasma process, it becomes one of the most important factors to improve the uniformity of the plasma density on the substrate, since it determines the uniformity and the reproducibility of the plasma process itself and, furthermore, the manufacturing production yield.

In the inductively coupled plasma processing apparatus, the plasma density distribution characteristics (profile) in the doughnut-shaped plasma generated near the dielectric window in the chamber are important, and the profile of the plasma density distribution affects the uniformity of the plasma density distribution obtained on the substrate after diffusion.

As for techniques for improving uniformity of radial density distribution of a plasma, there have been suggested several methods for dividing an RF antenna into a central and a peripheral spiral coil segment in a radial direction. Such RF antenna division methods include a first method for supplying a high frequency power to each of the spiral coil segments (e.g., Patent Document 1), a second method for controlling a distribution ratio of a high frequency power distributed from a single high frequency power supply to antennas/segments by varying impedances of the spiral coil segments in an additional circuit such as a capacitor or the like (e.g., Patent Document 2), a third method for connecting a central and a peripheral spiral coil segment to a single high frequency power supply in series and connecting a short-circuit switch or a variable capacitor to the central spiral coil segment in parallel (e.g., Patent Document 3), and the like.

PATENT DOCUMENTS

Patent Document 1: U.S. Pat. No. 5,401,350
Patent Document 2: U.S. Pat. No. 5,907,221
Patent Document 3: U.S. Pat. No. 5,731,565

Among the conventional RF antenna division method, the first method requires a plurality of high frequency power supplies and the same number of matching units, so that a configuration of a high frequency power supply unit becomes complicated and costs are sharply increased.

In the second method, the impedance of each antenna/segment is affected by the impedance of the plasma as well as the impedance of another antenna/segment, so that a distribution ratio can not be determined by only the additional circuit. Consequently, it is difficult to control the distribution ratio.

In the third method, when the short-circuit switch is used as a bypass circuit connected in parallel to the central spiral coil segment, it is only possible to perform general two-step control (ON/OFF). Further, when the variable capacitor is used, an optimal control value strongly depends on a plasma state. For example, when the current flowing through the central spiral coil segment needs to be reduced to a half of a current flowing through the peripheral spiral coil segment, it is difficult to perform such control because a control value for satisfying such condition is changed depending on a pressure or the high frequency power.

Even in the inductively coupled plasma processing apparatus, the distribution of the plasma generated in the chamber is easily varied depending on processing conditions such as a pressure, a high frequency power, a gas system and the like. Hence, it is an important task to generate a uniform plasma regardless of changes in the processing conditions, and a technique suitable for the task is required.

SUMMARY OF THE INVENTION

In view of the above, the present invention provides an inductively coupled plasma processing apparatus and a processing method therefore, capable of reducing loads of a high frequency power supply system, variously and arbitrarily controlling current distribution in an RF antenna regardless of processing conditions or plasma state, and improving uniformity or controllability of plasma density distribution.

In accordance with a first aspect of the present invention, there is provided a plasma processing apparatus including: a vacuum evacuable processing chamber, at least a portion of which is formed of a dielectric window; a substrate supporting unit for supporting a target substrate in the processing chamber; a processing gas supply unit for supplying a desired processing gas into the processing chamber to perform a desired plasma process on the substrate; an RF antenna, including a first and a second coil segment extending in parallel to each other, provided outside the dielectric window to generate a plasma of the processing gas in the processing chamber by inductive coupling; a high frequency power supply unit for supplying to the RF antenna a high frequency power having a frequency suitable for high frequency discharge of the processing gas; and a switching network switched among a parallel mode in which the first and the second coil segment are connected in parallel in the RF antenna, a multiplication series mode in which the first and the second coil segment are connected in series such that a direction of a current flowing through the first coil segment and a direction of a current flowing through the second coil segment are the same in a coil circling direction, and a minimization series mode in which the first and the second coil segment are connected in series such that a direction of a current flowing through the first coil segment and a direction of a current flowing through the second coil segment are opposite to each other in the coil circling direction.

In the plasma processing apparatus in accordance with the first aspect of the present invention, when the parallel mode is selected, the high frequency branch currents flow through the first and the second coil segment in accordance with the distribution ratio depending on the impedances thereof in the same direction along the coil circling direction. Further, the electromotive force obtained by adding the branch currents flowing through a couple of coils contributes to the plasma generation in the processing chamber. When the multiplication series mode is selected, the high frequency current flows through the first and the second coil segment in the same direction along the coil circling direction, so that the electromotive force of the combination coil which contributes to the plasma generation in the processing chamber is doubled. When the minimization series mode is selected, the high frequency current flows through the first and the second coil segment in the opposite direction along the coil circling direction, so that the electromotive force is minimized. Therefore, even though the current actually flows through the couple of coils, the current hardly flows through the plasma in the processing chamber. By selectively switching the parallel mode, the multiplication series mode and the minimization series mode by the switching network, the current density distribution in the doughnut-shaped plasma generated in the processing chamber can be controlled near the position of the couple of coils (a pair of coil segments) in multiple steps.

In accordance with a second aspect of the present invention, there is provided a plasma processing apparatus including: a vacuum evacuable processing chamber, at least a portion of which is formed of a dielectric window; a substrate supporting unit for supporting a target substrate in the processing chamber; a processing gas supply unit for supplying a desired processing gas into the processing chamber to perform a desired plasma process on the substrate; an RF antenna, including a first and a second coil segment extending in parallel to each other and a third and a fourth coil segment extending in parallel to each other with larger diameters than diameters of the first and the second coil segment, provided outside the dielectric window to generate a plasma of the processing gas in the processing chamber by inductive coupling; a high frequency supply unit for supplying to the RF antenna a high frequency power having a frequency suitable for high frequency discharge of the processing gas; a first switching network switched among a first parallel mode in which the first and the second coil segment are connected in parallel in the RF antenna, a first multiplication series mode in which the first and the second coil are connected in series such that a direction of a current flowing through the first coil segment and a direction of a current flowing through the second coil segment are the same in a coil circling direction, and a first minimization series mode in which the first and the second coil segment are connected in series such that a direction of a current flowing through the first coil segment and a direction of a current flowing through the second coil segment are opposite to each other in the coil circling direction; and a second switching network switched among a second parallel mode in which the third and the fourth coil segment are connected in parallel in the RF antenna, a second multiplication series mode in which the third and the fourth coil are connected in series such that a direction of a current flowing through the third coil segment and a direction of a current flowing through the fourth coil segment are the same in a coil circling direction, and a second minimization series mode in which the third and the fourth coil segment are connected in series such that a direction of a current flowing through the third coil segment and a direction of a current flowing through the fourth coil segment are opposite to each other in the coil circling direction.

In the plasma processing apparatus in accordance with the second aspect of the present invention, when the first parallel mode is selected, the high frequency branch currents flow through the first and the second coil segment in accordance with the distribution ratio of the impedances thereof in the same direction along the coil circling direction, and the electromotive force obtained by adding the branch currents flowing through the couple of coils contributes to the plasma generation in the processing chamber near the position of the combination coil (the first and the second coil segment). When the first multiplication series mode is selected, the high frequency current flows through the first and the second coil segment in the same direction along the coil circling direction, so that the electromotive force of the couple of coils which contributes to the plasma generation in the processing chamber is doubled near the position of the couple of coils. When the first minimization series mode is selected, the high frequency current flows through the first and the second coil segment in the opposite directions along the coil circling direction, so that the electromotive force is minimized. Therefore, even though the current actually flows through the couple of coils, the current hardly flows through the plasma in the processing chamber near the position of the couple of coils. By selectively switching the first parallel mode, the first multiplication series mode and the first minimization series mode by the switching network, the current density distribution in the doughnut-shaped plasma generated in the processing chamber can be controlled near the position of the couple of coils (a pair of coil segments) in multiple steps.

Meanwhile, when the second parallel mode is selected, the high frequency branch currents flow through the third and the fourth coil segment in accordance with the distribution ratio of the impedances thereof in the same direction along the coil circling direction, and the electromotive force obtained by adding the branch currents flowing through a couple of coils contributes to the plasma generation in the processing chamber near the position of the couple of coils (the third and the fourth coil segment). When the second multiplication series mode is selected, the high frequency current flows through the third and the fourth coil segment in the same direction along the coil circling direction, so that the electromotive force of the combination coil which contributes to the plasma generation in the processing chamber is doubled near the position of the couple of coils. When the second minimization series mode is selected, the high frequency current flows through the first and the second coil segment in the opposite directions along the coil circling direction, so that the electromotive force is minimized. Therefore, even though the current actually flows through the combination coil, the current hardly flows through the plasma in the processing chamber near the position of the combination coil. By selectively switching the second parallel mode, the second multiplication series mode and the second minimization series mode by the switching network, the current density distribution in the doughnut-shaped plasma generated in the processing chamber can be controlled near the position of the couple of coils (the third and the fourth coil segment) in multiple steps.

Hence, a plurality of (e.g., nine) combination modes can be selected for the electromotive force or the current path (current distribution) in the RF antenna. In each of the combination modes, the electromotive force distribution or the current distribution in the RF antenna is determined by the mode selected for each combination coil (parallel mode, multiplication series mode, minimization series mode). Moreover, desired current distribution or combined electromotive force can be obtained under any processing conditions (pressure/RF power/gas system) regardless of the plasma state.

In accordance with a third aspect of the present invention, there is provided a plasma processing apparatus including: a vacuum evacuable processing chamber, at least a portion of which is formed of a dielectric window; a substrate supporting unit for supporting a target substrate in the processing chamber; a processing gas supply unit for supplying a desired processing gas into the processing chamber to perform a desired plasma process on the substrate; an RF antenna, including a first and a second arc-shaped coil segment extending in parallel to each other and a third and a fourth arc-shaped coil segment extending in parallel to each other respectively along the circumferences of the first and the second coil segment, provided outside the dielectric window to generate a plasma of the processing gas in the processing chamber by inductive coupling; a high frequency power supply unit for supplying to the RF antenna a high frequency power having a frequency suitable for high frequency discharge of the processing gas; and a switching network switched among a parallel mode in which the first and the second coil segment are connected in parallel and the third and the fourth coil segment are connected in parallel in the RF antenna, a multiplication series mode in which the first and the third coil segment are connected in series and the second and the fourth coil segment are connected in series such that a direction of a current flowing through the first coil segment and a direction of a current flowing through the second coil segment are the same in a coil circling direction, and a direction of a current flowing through the third coil segment and a direction of a current flowing through the fourth coil segment are the same in the coil circling direction, and a minimization series mode in which the first and the second coil segment are connected in series and the third and the fourth coil segment are connected in series such that a direction of a current flowing through the first coil segment and a direction of a current flowing through the second coil segment are the opposite in the coil circling direction and a direction of a current flowing through the third coil segment and a direction of a current flowing through the fourth coil segment are opposite to each other in the coil circling direction.

The basic configurations and operations of the plasma processing apparatus in accordance with the third aspect of the present invention are the same as those of the plasma processing apparatus in accordance with the first aspect of the present invention except in that each of the coil segments is divided in the coil circling direction. In terms of effects, although the configuration of the switching network becomes complicated, the wavelength effect can be reduced due to the short lengths of the coil segments. Further, the variation in the current density distribution in the same direction can be reduced due to the presence of a large number of terminals or open ends of the coil segments in the coil circling direction.

In accordance with a first aspect of the present invention, there is provided a plasma processing method including: disposing a target substrate at a predetermined position below a dielectric window provided at a ceiling portion of a vacuum evacuable processing chamber; supplying a desired processing gas from a processing gas supply unit into the processing chamber; maintaining a pressure in the processing chamber at a predetermined depressurized state; selecting one among a parallel mode in which a first and a second coil segment extending in parallel to each other are connected in parallel in an RF antenna disposed above the dielectric window, a multiplication series mode in which the first and the second coil segment are connected in series such that a direction of a current flowing through the first coil segment and a direction of a current flowing through the second coil segment are the same in a coil circling direction, and a minimization series mode in which the first and the second coil segment are connected in series such that a direction of a current flowing through the first coil segment and a direction of a current flowing through the second coil segment are opposite to each other in the coil circling direction; allowing a high frequency current to flow through the first and the second coil segment connected in accordance with the selected mode by applying a high frequency power having a predetermined frequency from a high frequency power supply to the RF antenna; generating a plasma of the processing gas near the dielectric window in the processing chamber by an induced electric field and a magnetic field of a high frequency in accordance with the high frequency current flowing through the first and the second coil segment; diffusing the generated plasma in the processing chamber; and performing a desired plasma process on the substrate by using the plasma.

In accordance with a third aspect of the present invention, there is provided a plasma processing method including: disposing a target substrate at a predetermined position below a dielectric window provided at a ceiling portion of a vacuum evacuable processing chamber; supplying a desired processing gas from a processing gas supply unit into the processing chamber; maintaining a pressure in the processing chamber to a predetermined depressurized state; selecting one among a parallel mode in which a first and a second arc-shaped coil segment extending in parallel to each other are connected in parallel and a third and a fourth arc-shaped coil segment extending in parallel to each other are connected in parallel in an RF antenna disposed above the dielectric window, a multiplication series mode in which the first and the third coil segment are connected in series and the second and the fourth coil segment are connected in series such that a direction of a current flowing through the first coil segment and a direction of a current flowing through the second coil segment are the same in a coil circling direction and a direction of a current flowing through the third coil segment and a direction of a current flowing through the fourth coil segment are the same in the coil circling direction, and a minimization series mode in which the first and the second coil segment are connected in series and the third and the fourth coil segment are connected in series such that a direction of a current flowing through the first coil segment and a direction of a current flowing through the second coil segment are the opposite in the coil circling direction and a direction of a current flowing through the third coil segment and a direction of a current flowing through the fourth coil segment are opposite to each other in the coil circling direction; allowing a high frequency current to flow through the first to the fourth coil segment connected in accordance with the selected mode by applying a high frequency power having a predetermined high frequency from a high frequency power supply to the RF antenna; generating a plasma of the processing gas near the dielectric window in the processing chamber by an induced electric field and a magnetic field of a high frequency in accordance with the high frequency current flowing through the first to the fourth coil segment; diffusing the generated plasma in the processing chamber; and performing a desired plasma process on the substrate by using the plasma.

In accordance with the inductively coupled plasma processing apparatus and the plasma processing method therefor of the present invention, due to the above configuration and operation, loads of the RF power supply system are reduced, so that the uniformity or controllability of plasma density distribution can be improved with a simple structure of the RF antenna that can easily be manufactured.

BRIEF DESCRIPTION OF THE DRAWINGS

FIGS. 3A to 3D explain a function of switching current distribution or a current path in a central coil of the RF antenna in the first test example among a plurality of modes;

FIGS. 4A to 4D show modifications of the configurations and the functions shown in FIGS. 3A to 3D;

FIG. 6A describes operations of the RF antenna and the switching network in the first test example (first combination mode);

FIG. 6B describes operations of the RF antenna and the switching network in the first test example (second combination mode);

FIG. 6C describes operations of the RF antenna and the switching network in the first test example (third combination mode);

FIG. 6D describes operations of the RF antenna and the switching network in the first test example (fourth combination mode);

FIG. 6E describes operations of the RF antenna and the switching network in the first test example (fifth combination mode);

FIG. 6F describes operations of the RF antenna and the switching network in the first test example (sixth combination mode);

FIG. 6G describes operations of the RF antenna and the switching network in the first test example (seventh combination mode);

FIG. 6H describes operations of the RF antenna and the switching network in the first test example (eighth combination mode);

FIGS. 20A to 20C show a test example in which a peripheral coil (or a central coil) is formed of a single coil segment;

FIGS. 21A to 21C show a test example in which a gap between a pair of coil segments forming a couple of coils is arbitrarily increased;

FIG. 22E shows current density distribution in a doughnut-shaped plasma and a connection state of each unit in the case of selecting the [1AT/2AT] combination mode in the test example;

DETAILED DESCRIPTION OF THE EMBODIMENT

Hereinafter, embodiments of the present invention will be described with reference to the accompanying drawings which form a part hereof.
(Overall Configurations and Operations of Apparatus)

Figure 1:
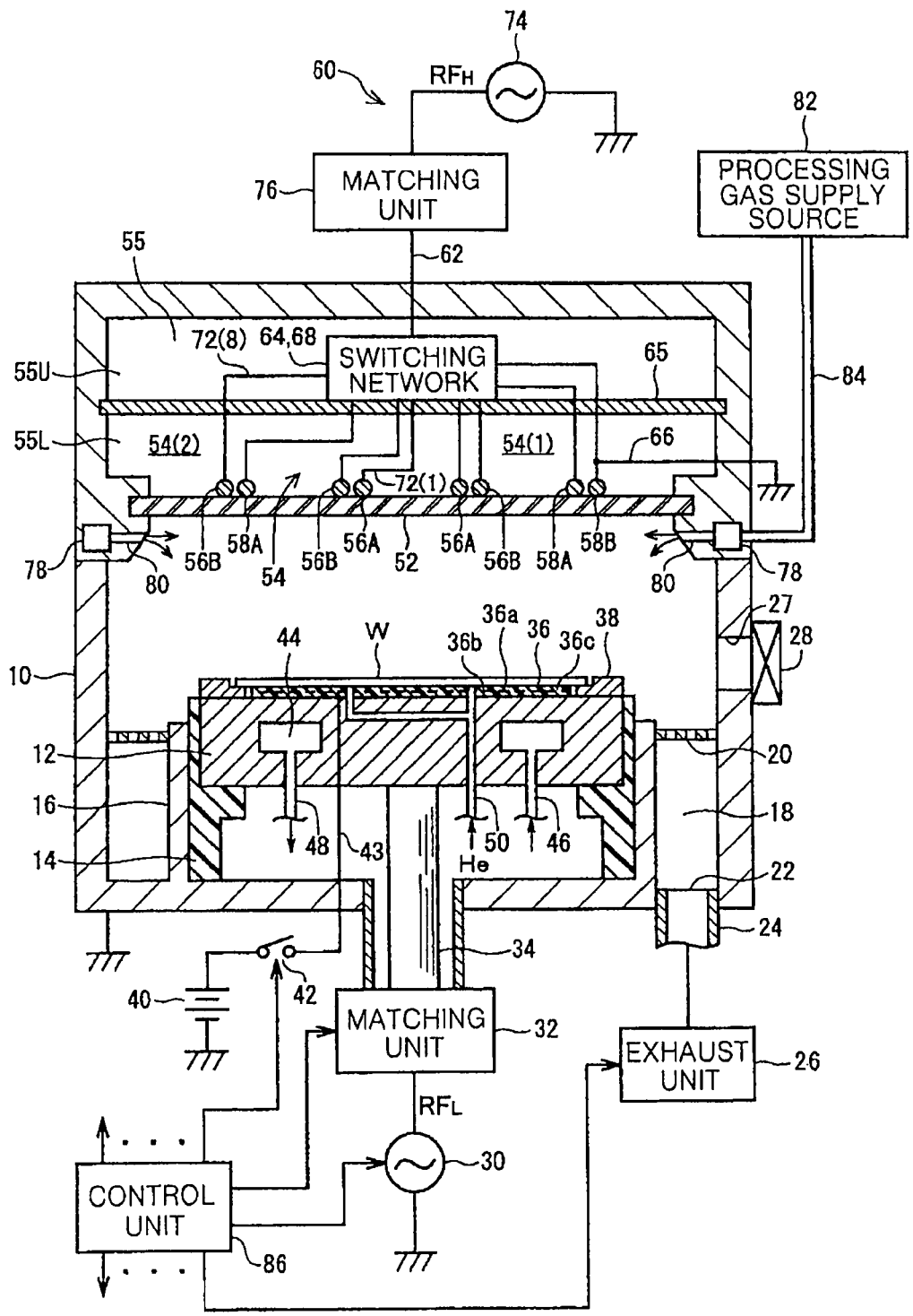
FIG. 1 is a longitudinal cross sectional view showing a configuration of an inductively coupled plasma etching apparatus in accordance with an embodiment of the present invention.

FIG. 1 shows a configuration of an inductively coupled plasma etching apparatus in accordance with an embodiment of the present invention. The inductively coupled plasma etching apparatus is of a type using a planar coil type RF antenna, and includes a cylindrical vacuum chamber (processing chamber) 10 made of a metal, e.g., aluminum, stainless steel or the like. The chamber 10 is frame-grounded.

In the inductively coupled plasma etching apparatus, various units having no involvement in plasma generation will be described first.

At a lower central portion of the chamber 10, a circular plate-shaped susceptor 12 for mounting thereon a target substrate, e.g., a semiconductor wafer W as a substrate supporting table is horizontally arranged. The susceptor 12 also serves as a high frequency electrode. The susceptor 12, which is made of, e.g., aluminum, is supported by an insulating cylindrical support 14 uprightly extending from a bottom portion of the chamber 10.

A conductive cylindrical support 16 is provided uprightly extending from the bottom portion of the chamber 10 along the periphery of the insulating cylindrical support 14, and an annular exhaust path 18 is defined between the support 16 and an inner wall of the chamber 10. Moreover, an annular baffle plate 20 is attached to an entrance or a top portion of the exhaust path 18, and an exhaust port 22 is provided at a bottom portion thereof. In order to allow a gas to uniformly flow in the chamber 10 axisymmetrically with regard to the semiconductor wafer W on the susceptor 12, it is preferable to provide a plurality of exhaust ports 22 at a regular interval circumferentially. The exhaust ports 22 are connected to an exhaust unit 26 via respective exhaust lines 24. The exhaust unit 26 includes a vacuum pump such as a turbo molecular pump to evacuate a plasma-processing space in the chamber 10 to a desired vacuum level. Attached to the sidewall of the chamber 10 is a gate valve 28 for opening and closing a loading/unloading port 27.

A high frequency power supply 30 for an RF bias is electrically connected to the susceptor 12 via a matching unit 32 and a power feed rod 34. The high frequency power supply 30 outputs a variable high frequency power $RF_L$ of an appropriate frequency (e.g., 13.56 MHz or less) to control the energy for attracting ions toward the semiconductor wafer W. The matching unit 32 includes a variable-reactance matching circuit for performing the matching between the impedances of the high frequency power supply 30 and the load (mainly, susceptor, plasma and chamber), and the matching circuit includes a blocking capacitor for generating a self-bias.

An electrostatic chuck 36 is provided on an upper surface of the susceptor 12 to hold the semiconductor wafer W by an electrostatic attraction force, and a focus ring 38 is provided around the electrostatic chuck 36 to annularly surround the periphery of the semiconductor wafer W. The electrostatic chuck 36 includes an electrode 36a made of a conductive film and a pair of dielectric films 36b and 36c that sandwich the electrode 36a. A high voltage DC power supply 40 is electrically connected to the electrode 36a via a switch 42 and a coated line 43. By applying a high DC voltage from the DC power supply 40 to the electrode 36a, the semiconductor wafer W can be attracted to and held on the electrostatic chuck 36 by the electrostatic force.

A coolant path 44, which extends in, e.g., a circumferential direction, is provided inside the susceptor 12. A coolant, e.g., a cooling water, of a predetermined temperature is supplied from a chiller unit (not shown) to the coolant path 44 to be circulated through pipelines 46 and 48. By adjusting the temperature of the coolant, it is possible to control a process temperature of the semiconductor wafer W held on the electrostatic chuck 36. Moreover, a heat transfer gas, e.g., He gas, is supplied from a heat transfer gas supply unit (not shown) to a space between a top surface of the electrostatic chuck 36 and a bottom surface of the semiconductor wafer W through a gas supply line 50. Further, an elevating mechanism (not shown) including lift pins capable of being moved up and down while vertically extending through the susceptor 12 and the like is provided to load and unload the semiconductor wafer W.

Next, various units having involvement in the plasma generation in the inductively coupled plasma etching apparatus will be described.

A ceiling or a ceiling plate of the chamber 10 is separated from the susceptor 12 at a relatively large distance, and a circular dielectric window 52 formed of, e.g., a quartz plate is airtightly provided in the ceiling. Above the dielectric window 52, an antenna chamber 55 for accommodating an RF antenna 54 while electronically shielding it from the outside is provided integrally with the chamber 10. The RF antenna 54 is used to generate an inductively coupled plasma in the chamber 10.

The RF antenna 54 of the present embodiment includes two coils 54(1) and 54(2) disposed coaxially on the same plane in parallel to the dielectric window 52.

More specifically, the primary coil 54(1) is positioned at the central portion of the RF antenna 54 and includes a pair of coil segments 56A and 56B made of the same wire material and having the same thickness (cross sectional area) and a similar diameter. The coil segments 56A and 56B extend in parallel to each other in an annular shape with a predetermined extremely small gap $g_1$ (preferably smaller than a skin depth $\delta$) therebetween, each forming circular single-wound coil. Since the coil segments 56A and 56B are made of the same wire material and have the same cross sectional area and a similar diameter (i.e., coil length), the impedances thereof are similar to each other.

Meanwhile, the secondary coil 54(2) is positioned at the peripheral portion of the RF antenna 54 and includes a pair of coil segments 58A and 58B made of the same wire material and having the same thickness (cross sectional area) and a similar diameter. The coil segments 58A and 58B extend in parallel to each other in an annular shape with a predetermined extremely small gap $g_2$ (preferably smaller than a skin depth $\delta$) therebetween, each forming circular single-wound coil. Since the coil segments 58A and 58B are made of the same wire material and have the same cross sectional area and a similar diameter (i.e., coil length), the impedances thereof are similar to each other.

The skin depth $\delta$ is obtained by the following equation: $\delta=(2/\omega\sigma\mu)^{1/2}$ ($\omega=2\pi f$), wherein f indicates the frequency of the high frequency current flowing through the RF antenna 54, and $\sigma$ and $\mu$ represent the conductivity and the permeability of the coils 54(1) and 54(2), respectively.

Figure 2:
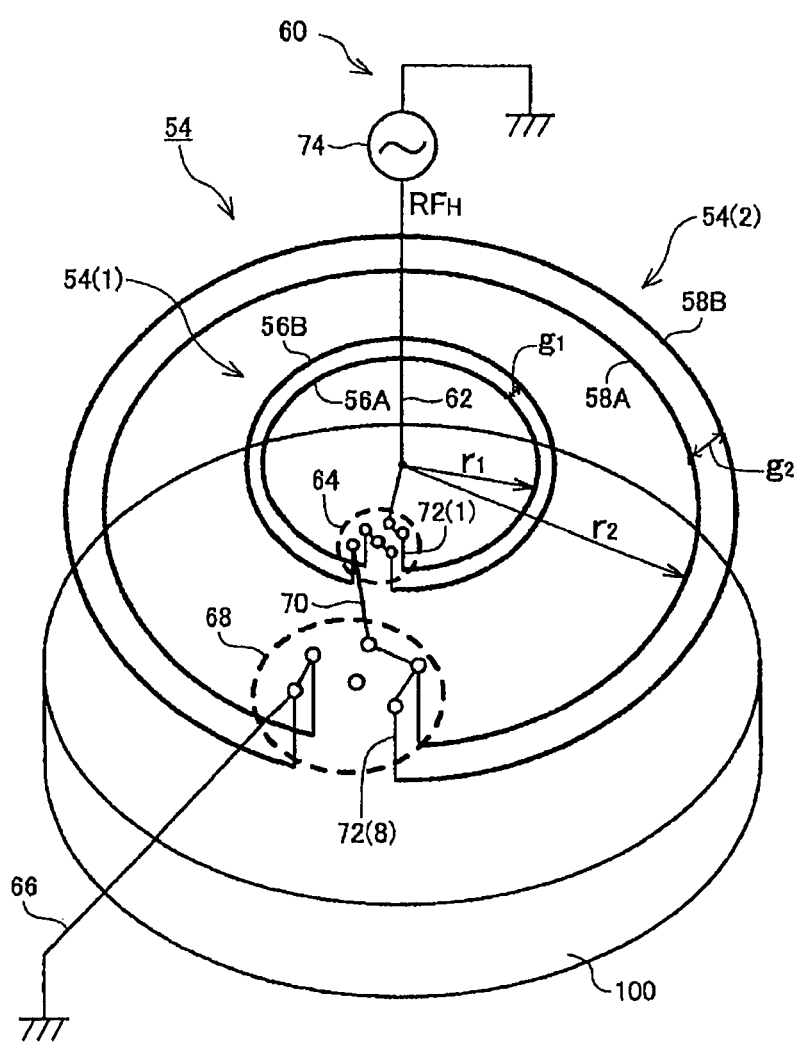
FIG. 2 is a perspective view showing an arrangement configuration of an RF antenna and a switching network in a first test example.

As shown in FIG. 2, the terminals or the open ends of the coil segments 56A and 56B of the central coil 54(1) are located at the same positions in the coil circling direction. Here, in the coil circling direction, both ends of the inner coil segment 56A are close to each other via a gap, and both ends of the outer coil segment 56B are close to each other via a gap. In the horizontal direction (coil radial direction) perpendicular to the coil circling direction, one ends of the inner and the outer coil segment 56A and 56B are close to each other via a gap, and the other ends of the outer coil segment 56A and 56B are close to each other via a gap.

A terminating end of a high frequency power supply line 62 from a high frequency power supply unit 60 for plasma generation which will be described later is positioned near or above the open ends of the central coil 54(1). A first switching network 64 is provided between the terminating end of the high frequency power supply line 62 and both ends of the inner and the outer coil segment 56A and 56B.

The peripheral coil 54(2) has the same configuration as that of the central coil 54(1). In other words, the terminals or the open ends of the coil segments 58A and 58B are located at the same positions in the coil circling direction. Here, in the coil circling direction, both ends of the inner coil segment 58A are close to each other, and both ends of the outer coil segment 58B are close to each other. In the horizontal direction (coil radial direction) perpendicular to the coil circling direction, one ends of the inner and the outer coil segments 58A and 58B are close to each other, and the other ends of the inner and the outer coil segments 58A and 58B are close to each other.

A starting end of a ground wire 66 or an RF return wire connected to another ground potential member (not shown) maintained at an electrically ground potential or to the chamber 10 is positioned near or above the open ends of the peripheral coil 54(2). A second switching network 68 is provided between the starting end of the RF ground wire 66 and both ends of the inner and the outer coil segment 58A and 58B. The first switching network 64 and the second switching network 68 are electrically connected to each other via a conductor or a conducting wire 70 provided therebetween.

In FIG. 1, the antenna chamber 55 is divided into an upper antenna chamber 55U and a lower antenna chamber 55L by a horizontal partition plate 65. The central and the peripheral coil 54(1) and 54(2) forming the RF antenna 54 are disposed in the lower antenna chamber 55L, and the first and the second switching network 64 and 68 are disposed in the upper antenna chamber 55U. The coils 54(1) and 54(2) in the lower antenna chamber 55L and the switching networks 64 and 68 in the upper antenna chamber 55U are electrically connected to each other via conducting wires 72(1) to 72(8) or conductors electrically insulated from the partition plate 65. The partition plate 65 is formed of a conductive plate and has a function of electromagnetically shielding the RF antenna 54 and the switching networks 64 and 68.

The high frequency power supply unit 60 includes the high frequency power supply 74 and the matching unit 76. The high frequency power supply 74 outputs at a variable high frequency power $RF_H$ of an appropriate frequency (e.g., 13.56 MHz or more) for plasma generation by high frequency discharge. The matching unit 76 includes a variable-reactance matching circuit for performing the matching between the impedances of the high frequency power supply 74 and the load (mainly, the RF antenna, the plasma).

A processing gas supply unit for supplying a processing gas to the processing space in the chamber 10 includes: a buffer unit 78 or an annular manifold provided inside (or outside) the sidewall of the chamber 10 to be located at a place slightly lower than the dielectric window 52; a plurality of sidewall gas injection openings 80 circumferentially spaced apart from each other at a regular interval and opened to the plasma-generation space from the buffer unit 78; and a gas supply line 84 extending from the processing gas supply source 82 to the buffer unit 78. The processing gas supply source 82 includes a mass flow controller and an opening/closing valve (all not shown).

A control unit 86 includes, e.g., a microcomputer, and controls the overall operation (sequence) of the plasma etching apparatus and individual operations of various units, e.g., the gas exhaust unit 26, the high frequency power supplies 30 and 74, the matching units 32 and 76, the electrostatic switch 42, the processing gas supply source 82, the switching networks 64 and 68, the chiller unit (not shown), the heat transfer gas supply unit (not shown) and the like.

When the inductively coupled plasma etching apparatus performs an etching process, the gate valve 28 is first opened to load a semiconductor wafer W to be processed into the chamber 10 and mount it onto the electrostatic chuck 36. Then, the gate valve 28 is closed, and an etching gas (typically, a gaseous mixture) is introduced from the processing gas supply source 82 into the chamber 10 at a preset flow rate and flow rate ratio via the gas supply line 84, the buffer unit 78 and the sidewall gas injection openings 80. The inner pressure of the chamber 10 is adjusted to a set value by the gas exhaust unit 26. Thereafter, the high frequency power supply 74 of the high frequency power feed unit 60 is turned on to output the high frequency $RF_H$ power for plasma generation at a predetermined high frequency power level, and the current of the high frequency power $RF_H$ is supplied to the central coil 54(1) and the peripheral coil 54(2) of the RF antenna 54 via the matching unit 76, the high frequency power supply line 62 and the switching networks 64 and 68. Meanwhile, the high frequency power supply 30 is turned on to output a high frequency $RF_L$ power for ion attraction control at a predetermined high frequency power level, and the high frequency power $RF_L$ is supplied to the susceptor 12 via the matching unit 32 and the power feed rod 34. Moreover, a heat transfer gas (He gas) is supplied from the heat transfer gas supply unit to a contact interface between the electrostatic chuck 36 and the semiconductor wafer W, and the switch 42 is turned on to confine the heat transfer gas in the contact interface by the electrostatic attraction force of the electrostatic chuck 36.

In the chamber 10, the etching gas injected through the sidewall gas injection openings 80 is diffused to the processing space below the dielectric window 52. The magnetic force lines (magnetic flux) generated around the central and the peripheral coil 54(1) and 54(2) of the RF antenna 54 by the current of the high frequency power $RF_H$ flowing through these coils travel through the dielectric window 52 and across the processing space (plasma generation space), to thereby induce an electric field azimuthally in the processing space. The electrons azimuthally accelerated by the induced electric field collide with molecules or atoms in the etching gas, to thereby ionize the etching gas and generate a doughnut-shaped plasma.

The radicals or the ions of the doughnut-shaped plasma are diffused in all direction in the large processing space. The radicals are scattered isotropically, and the ions are attracted by the DC bias onto the top surface (target substrate) of the semiconductor wafer W. Hence, active species of the plasma cause chemical and physical reaction on the surface to be processed of the semiconductor wafer W, thereby etching a film to be processed in a desired pattern.

Here, the expression "doughnut-shaped plasma" indicates not only a state where the plasma is generated only at the radially outer portion in the chamber 10 without being generated at the radially inner portion (at the central portion) therein but also a state where the volume or density of the plasma generated at the radially outer portion becomes larger than that at the radially inner portion. Moreover, the plasma may be generated in another shape other than the doughnut shape depending on the type of the processing gas, the inner pressure of the chamber 10 or the like.

In the inductively coupled plasma etching apparatus, the RF antenna 54 is divided in a radial direction into the central coil 54(1) and the peripheral coil 54(2) in order to improve the radial uniformity of the plasma processing characteristics, i.e., the etching characteristics (etching rate, selectivity, etching shape and the like), on the semiconductor wafer W. The central coil 54(1) as a primary coil includes a pair of coil segments 56A and 56B arranged close to each other and extending in parallel at a uniform radius, and the peripheral coil 54(2) as a secondary coil includes a pair of coil segments 58A and 58B arranged close to each other and extending in parallel at a uniform radius. As will be described later, the current path or the current distribution in the RF antenna 54 can be variously and arbitrarily selected by the first and the second switching network 64 and 68. Further, the combined electromotive force (especially, the radial distribution of the electromotive force) of the RF antenna 54 coupled by electromagnetic induction to the plasma in the processing space via the dielectric window 52 can be controlled in multiple steps.

[Basic Functions of RF Antenna and Switching Network in First Test Example]

Hereinafter, the function of switching the current distribution or the current path in the central coil 54(1) among a plurality of modes will be described with reference to FIGS. 3A to 3D. In FIGS. 3A to 3D, the peripheral coil 54(2) is omitted for convenience of explanation and easiness of comprehension.

The first switching network 64 includes three switches 90(1), 92(1) and 94(1) for switching the current path in the central coil 54(1).

The first switch 90(1) can switch the first terminal 88(1) positioned at the terminating end of the high frequency power supply line 62 from the high frequency power supply unit 60 among a position (shown in FIGS. 3B and 3C) connected to one end of the inner coil segment 56A, a position (shown in FIG. 3D) connected to the other end of the inner coil segment 56A, and a position (shown in FIG. 3A) disconnected from one end and the other end of the inner coil segment 56A.

The second switch 92(1) can switch the other end of the inner coil segment 56A among a position (shown in FIG. 3C) connected to one end of the outer coil segment 56B, a position (shown in FIG. 3B) connected to the other end of the outer coil segment 56B, and a position (shown in FIG. 3D) disconnected from one end and the other end of the outer coil segment 56B.

The third switch 94(1) can switch one end of the outer coil segment 56B between a position (shown in FIG. 3B) connected to one end of the inner coil segment 56A and a position (shown in FIG. 3C) connected to the other end of the inner coil segment 56A.

Preferably, each of the switches 90(1), 92(1) and 94(1) is formed of a vacuum switch or a vacuum relay and is switched by an individual switch driving circuit (not shown) under the control of the control unit 86. Depending on the combination types of the switching positions of the three switches 90(1), 92(1) and 94(1), the connection type between the inner coil segment 56A and the outer coil segment 56B, i.e., the current path or the current distribution in the central coil 54(1), can be adjusted to four modes shown in FIGS. 3A to 3D.

FIG. 3A shows a non-conductive mode in which the first switch 90(1) is switched to a position for disconnecting the first terminal 88(1) from one end and the other end of the inner coil segment 56A. The second and the third switch 92(1) and 94(1) may be set to any position. In the non-conductive mode, the high frequency current path is blocked by the first switch 90(1), so that the high frequency current does not flow through the central coil 54(1). Hence, the magnetomotive force of the central coil 54(1) becomes 0 ampere turn (AT).

FIG. 3B shows a parallel mode in which the first terminal 88(1) is connected to one end of the inner coil segment 56A via the first switch 90(1); the other end of the inner coil segment 56A is connected to the other end of the outer coil segment 56B; and one end of the outer coil segment 56B is connected to one end of the inner coil segment 56A via the third switch 94(1).

In the parallel mode, the high frequency current I transmitting along the high frequency power supply line 62 is branched from the first terminal 88(1) to the inner coil segment 56A and the outer coil segment 56B via the first and the third switch 90(1) and 94(1). Here, since the coil segments 56A and 56B have substantially the same impedance, the high frequency current is divided into high frequency branch currents I/2 and I/2 and supplied to the coil segments 56A and 56B. The high frequency branch currents I/2 and I/2 flow through the coil segments 56A and 56B in the positive direction (counterclockwise direction in the drawing) and join each other via the second switch 92(1). Then, the high frequency current I flows through the RF return wire or the ground wire 66.

As such, in the parallel mode, the high frequency branch currents I/2 and I/2 flow through the inner and the outer coil segment 56A and 56B of the central coil 54(1) in the positive direction, and the combined electromotive force of 1 AT is obtained from the entire coil. Since both coil segments 56A and 56B are positioned close to each other, the electromagnetic effect (inductive coupling effect) equal to that of a case the high frequency current I flows through one single-wound coil is obtained in the plasma and the processing space opposite thereto with respect to the dielectric window 52.

FIG. 3C shows a multiplication series mode in which the first terminal 88(1) is connected to one end of the inner coil segment 56A via the first switch 90(1), and the other end of the inner coil segment 56A is connected to one end of the outer coil segment 56B via the second and the third switch 92(1) and 94(1).

In the multiplication series mode, the high frequency current I transmitting along the high frequency power supply line 62 flows through the inner coil segment 56A via the first terminal 88(1) and the first switch 90(1) in the positive direction, and then flows through the outer coil segment 56B via the second and the third switch 92(1) and 94(1) in the positive direction. Next, the high frequency current I is directed to the RF ground wire 66.

As such, in the multiplication series mode, the high frequency current I flows through the inner and the outer coil segment 56A and 56B of the central coil 54(1) in the same direction (positive direction), and the combined electromotive force of 2 AT is obtained from the entire coil. Since both coil segments 56A and 56B are positioned close to each other, the electromagnetic effect (inductive coupling effect) equal to that of a case the high frequency current 2I twice higher than the high frequency current I transmitting along the high frequency power supply line 62 flows through one single-wound coil is obtained in the plasma and the processing space opposite thereto with respect to the dielectric window 52.

FIG. 3D shows a minimization series mode in which the first terminal 88(1) is connected to the other end of the inner coil segment 56A via the first switch 90(1) and one end of the inner coil segment 56A is connected to one end of the outer coil segment 56B via the third switch 94(1). The other end of the inner coil segment 56A and the other end of the outer coil segment 56B are electrically insulated from each other by the second switch 92(1).

In the minimization series mode, the high frequency current I transmitted along the high frequency power supply line 62 flows through the inner coil segment 56A via the first terminal 88(1) and the first switch 90(1) in the negative direction (clockwise direction in the drawing) and then flows through the outer coil segment 56B in the positive direction via the third switch 94(1). Next, the high frequency current I is directed to the RF ground wire 66.

As such, in the minimization series mode, the high frequency current I flows through the inner and the outer coil segment 56A and 56B of the central coil 54(1) in the positive and the negative direction, respectively, and the combined electromotive force of the entire coil becomes 0 AT. Therefore, the electromagnetic effect obtained when the high frequency current I hardly flows through the plasma in the processing space opposite to the dielectric window 52 despite that the high frequency current I flows through the central coil 54(1) is obtained.

FIGS. 4A to 4D illustrate a modification of the first switching network 64. In this modification, the high frequency power supply line 62 is terminated at one end of the inner coil segment 56A.

The first switch 90(1) can switch the second terminal 96(1) connected or connectable to the RF ground wire 66 among a position (shown in FIGS. 4B and 4C) connected to the other end of the outer coil segment 56B, a position (shown in FIG. 4D) connected to one end of the outer coil segment 56B, and a position (shown in FIG. 4A) disconnected from one end and the other end of the outer coil segment 56B.

The second switch 92(1) can switch one end of the outer coil segment 56B among a position (shown in FIG. 4C) connected to the other end of the inner coil segment 56A, a position (shown in FIG. 4B) connected to one end of the inner coil segment 56A, and a position (shown in FIG. 4D) disconnected from one end and the other end of the inner coil segment 56A.

The third switch 94(1) can switch the other end of the inner coil segment 56A between a position (shown in FIG. 4B) connected to the other end of the outer coil segment 56B and a position (shown in FIG. 4C) connected to one end of the outer coil segment 56B.

Evan in this modification, depending on the combination types of the switching positions of the three switches 90(1), 92(1) and 94(1)), the connection type between the inner coil segment 56A and the outer coil segment 56B, i.e., the current path in the central coil 54(1), can be adjusted to four modes shown in FIGS. 4A to 4D, and the electromotive force of the entire coil can be adjusted to desired three levels (0 AT, 1 AT and 2 AT). Due to the function of controlling the electromotive force of the entire coil by switching the current path or the current distribution in the central coil 54(1), the operational effects same as those of the test example of FIGS. 3A to 3D can be obtained.

Figure 5A:
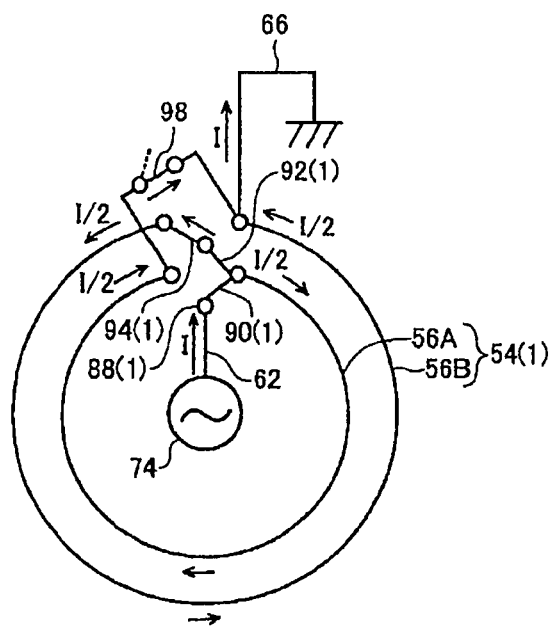
FIG. 5A shows a modification of the configurations and the functions shown in FIGS. 3A to 3D.
Figure 5B:
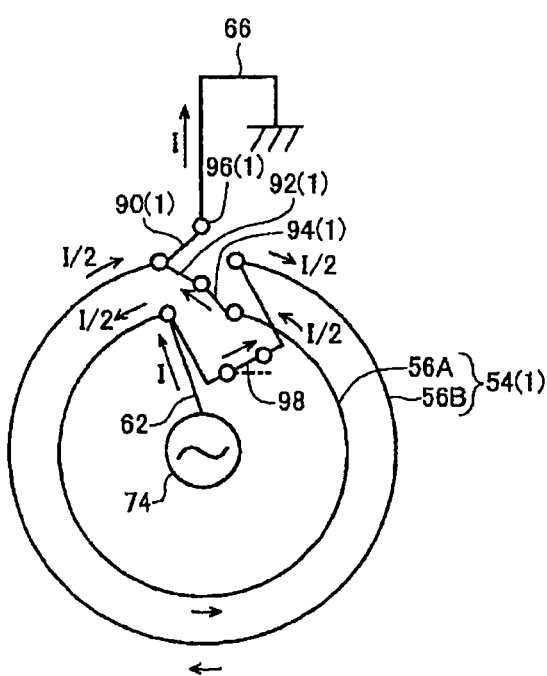
FIG. 5B shows a modification of the configurations and the functions shown in FIGS. 4A to 4D.

In another modification, as shown in FIGS. 5A and 5B, a switch 98 may be provided between one end of the inner coil segment 56A and the other end of the outer coil segment 56B. The switch 98 is switched to an ON state in the multiplication series mode and to an OFF state in the parallel connection mode or the multiplication series mode.

In the RF antenna 54 of this test example, the peripheral coil 54(2) has the same configuration and function as those of the central coil 54(1) except for a coil diameter. Further, the second switching network 68 has the same configuration and function as those of the first switching network 64.

More specifically, as shown in FIGS. 6A and 6B, the second switching network 64 has a fourth to a sixth switch 90(2), 92(2) and 94(2) for switching the current path in the peripheral coil 54(2).

The fourth switch 90(2) can switch a conductive terminal (first terminal) 88(2) connected or connectable to the high frequency power supply line 62 via the central coil 54(1) among a position (shown in FIGS. 6B and 6E) connected to one end of the inner coil segment 58A, a position (shown in FIGS. 6A, 6C, 6D, 6F, 6G and 6H) connected to the other end of the inner coil segment 58A, and a position (not shown) disconnected from one end and the other end of the inner coil segment 58A.

The fifth switch 92(2) can switch one end of the inner coil segment 58A among a position (shown in FIGS. 6A, 6C and 6G) connected to one end of the outer coil segment 58B, a position (shown in FIGS. 6D, 6F and 6H) connected to the other end of the outer coil segment 58B, and a position (shown in FIGS. 6B and 6E) disconnected from one end and the other end of the outer coil segment 56B.

The sixth switch 94(2) can switch the other end of the outer coil segment 58B between a position (shown in FIGS. 6A, 6B, 6C, 6E and 6G) connected to the other end of the inner coil segment 58A and a position (shown in FIGS. 6D, 6F and 6H) connected to one end of the inner coil segment 58A.

Preferably, each of the switches 90(2), 92(2) and 94(2) is formed of a vacuum switch or a vacuum relay, and is switched by a single-purpose driving circuit (not shown) under the control of the control unit 86. Depending on the combination types of the switching positions of the three switches 90(2), 92(2) and 94(2), the current path in the peripheral coil 54(2) (the connection type between the inner coil segment 58A and the outer coil segment 58B) can be adjusted to four modes (non-conductive mode, parallel mode, multiplication mode and minimization mode) as in the case of the central coil 54(1). Further, the combined electromotive force of the entire coil can be adjusted to desired three levels (0 AT, 1 AT and 2AT) regardless of the plasma state, i.e., the processing conditions (pressure/RF power/gas system).

If either the coil 54(1) or the peripheral coil 54(2) is adjusted to the non-conductive mode, the other coil is also adjusted to the non-conductive mode. Further, even when the output of the high frequency power $RF_H$ from the high frequency power supply 74 is stopped, the central coil 54(1) and the peripheral coil 54(2) are adjusted to the non-conductive mode. Therefore, the non-conductive mode is not necessary in each of the coils 54(1) and 54(2).

[Operations of RF Antenna and Switching Network in First Test Example]

In the inductively coupled plasma etching apparatus of the present embodiment, since the high frequency current supplied from the high frequency power supply unit 60 flows through the RF antenna 54, a loop-shaped high frequency AC magnetic field is generated around the coils forming the RF antenna 54 in accordance with the Ampere-Maxwell law, and magnetic force lines crossing the processing space in the radial direction are formed in the comparatively inner (lower) region below the dielectric window 52.

Here, the radial (horizontal) components in the processing space are constantly zero at the central and the peripheral portion of the chamber 10 regardless of the value of the high frequency current, and become maximum at a certain portion therebetween. The azimuthal distribution of the intensity of the induced electric field generated by the high frequency AC magnetic field has the same profile as that of the radial distribution of the magnetic flux density. In other words, in a macroscopic view, the radial electron density distribution in the doughnut-shaped plasma substantially corresponds to the current distribution in the RF antenna 54.

Unlike a conventional spiral coil extending from its center or inner peripheral end to its outer peripheral end, the RF antenna 54 of the present embodiment includes the central coil 54(1) positioned at its central portion and the peripheral coil 54(2) positioned at its peripheral portion. Thus, the radial current distribution in the RF antenna 54 is bipolar near the positions of the coils 54(1) and 54(2).

In the RF antenna 54 of the present embodiment, the current path (current distribution) in the central coil 54(1) and the peripheral coil 54(2) can be switched among three modes (parallel mode, multiplication series mode and minimization series mode) by the first and the second switching network 64 and 68, and the combined electromotive force of the coils 54(1) and 54(2) can be adjusted to the three levels (0 AT, 1 AT, 2 AT). Accordingly, the combined electromotive force or the current path (current distribution) in the RF antenna 54 can be adjusted to nine (3×3) combination modes. In each of the combination modes, theoretically, the electromotive force distribution or the current distribution in the RF antenna 54 is determined by the modes of the central coil 54(1) and the peripheral coil 54(2) (parallel mode, multiplication series mode and minimization series mode) regardless of the plasma state. In other words, desired current distribution or combined electromotive force is obtained under any processing conditions (pressure/high frequency power/gas system).

In the first combination mode of FIG. 6A, the central coil 54(1) is switched to the minimization series mode (0 AT), and the peripheral coil 54(2) is switched to the parallel mode (1 AT). In that case, theoretically, a doughnut-shaped plasma generated in the processing space in the chamber 10 has a current density that is decreased to close to zero near the position directly below the central coil 54(1) and increased to the highest level (maximum value) in accordance with an electromotive force of about 1 AT near the position directly below the peripheral coil 54(2).

In the second combination mode of FIG. 6B, the central coil 54(1) is switched to the parallel mode (1 AT), and the peripheral coil 54(2) is switched to the minimization series mode (0 AT). In that case, theoretically, the doughnut-shaped plasma generated in the processing space has a current density that is increased to the highest level (maximum value) in accordance with an electromotive force of about 1 AT near the position directly below the central coil 54(1) and decreased to close to zero near the position directly below the peripheral coil 54(2).

In the third combination mode of FIG. 6C, the central coil 54(1) is switched to the parallel mode (1 AT), and the peripheral coil 54(2) is switched to the parallel mode (1 AT). In that case, theoretically, the doughnut-shaped plasma generated in the processing space has a current density that is increased to the highest level (maximum value) in accordance with an electromotive force of about 1 AT near the position directly below the central coil 54(1) and increased to the highest level (maximum value) in accordance with an electromotive force of about 1 AT near the position directly below the peripheral coil 54(2).

In the fourth combination mode of FIG. 6D, the central coil 54(1) and the peripheral coil 54(2) are switched to the multiplication series mode (2 AT). In that case, theoretically, the doughnut-shaped plasma generated in the processing space has a current density that is increased to the highest level (maximum value) in accordance with an electromotive force of about 2 AT near the position directly below the central coil 54(1) and increased to the highest level (maximum value) in accordance with an electromotive force of about 2 AT near the position directly below the peripheral coil 54(2).

In the fifth combination mode of FIG. 6E, the central coil 54(1) is switched to the multiplication series mode (2 AT), and the peripheral coil 54(2) is switched to the minimization series mode (0 AT). In that case, theoretically, the doughnut-shaped plasma generated in the processing space has a current density that is increased to the highest level (maximum value) in accordance with an electromotive force of about 2 AT near the position directly below the central coil 54(1) and decreased to close to zero near the position directly below the peripheral coil 54(2).

In the sixth combination mode of FIG. 6F, the central coil 54(1) is switched to the minimization series mode (0 AT), and the peripheral coil 54(2) is switched to the multiplication series mode (2 AT). In that case, theoretically, a doughnut-shaped plasma generated in the processing space in the chamber 10 has a current density that is decreased to close to zero near the position directly below the central coil 54(1) and increased to the highest level (maximum value) in accordance with an electromotive force of about 2 AT near the position directly below the peripheral coil 54(2).

In the seventh combination mode shown in FIG. 6G, the central coil 54(1) is switched to the multiplication series mode (2 AT), and the peripheral coil 54(2) is switched to the parallel mode (1 AT). In that case, theoretically, the doughnut-shaped plasma generated in the processing space has a current density that is increased to the highest level (maximum value) in accordance with an electromotive force of about 2 AT near the position directly below the central coil 54(1) and increased to the highest level (maximum value) in accordance with an electromotive force of about 1 AT near the position directly below the peripheral coil 54(2).

In the eighth combination mode of FIG. 6H, the central coil 54(1) is switched to the parallel mode (1 AT), and the peripheral coil 54(2) is switched to the multiplication series mode (2 AT). In that case, theoretically, the doughnut-shaped plasma generated in the processing space has a current density that is increased to the highest level (maximum value) in accordance with an electromotive force of about 1 AT near the position directly below the central coil 54(1) and increased to the highest level (maximum value) in accordance with an electromotive force of about 2 AT near the position directly below the peripheral coil 54(2).

In the ninth combination mode (not shown), the central coil 54(1) can be switched to the minimization series mode (0 AT), and the peripheral coil 54(2) can be switched to the minimization series mode (0 AT). In that case, theoretically, the doughnut-shaped plasma generated in the processing space has a current density that is decreased to close to zero near the position directly below the central coil 54(1) and the position directly below the peripheral coil 54(2).

In the first to the eighth combination mode, the current density distribution in the doughnut-shaped plasma is not uniform in the radial direction and has an uneven profile. However, the uniformity of the plasma density near the susceptor 12, i.e., on the substrate W, can be considerably improved by diffusing the plasma in all directions in the processing space in the chamber 10. In other words, in order to improve the uniformity of the radial distribution of the plasma density on the substrate W, the current density distribution in the doughnut-shaped plasma needs to be balanced between the central portion and the peripheral portion on the substrate W. However, the optimal balance is affected by the processing conditions (pressure/RF power/gas system) or the plasma state. Therefore, the uniformity of the plasma density distribution on the substrate W can be improved by variously and arbitrarily varying the balance of the current density distribution in the doughnut-shaped plasma between the central portion and the peripheral portion.

The present applicant performed the following electromagnetic simulation by using the inductively coupled plasma etching apparatus of the present embodiment.

In other words, the radial distribution of the current density (corresponding to the plasma density distribution) in the doughnut-shaped plasma (region within about 5 mm from the top surface) was calculated in several combination modes that can be selected for the RF antenna 54. As a result, the profiles of FIGS. 7A to 7E were obtained.

In this electromagnetic simulation, the cross sectional dimensions of the coil segments 56A, 56B, 58A and 58B forming the RF antenna 54 were set to about 5 mm×5 mm, and the inner diameters (radiuses) of the inner and the outer coil segment 56A and 56B of the central coil 54(1) were set to about 100 mm and 110 mm, respectively. Further, the inner diameters (radiuses) of the inner and the outer coil segment 58A and 58B of the peripheral coil 54(2) were set to about 200 mm and 210 mm, respectively. The value of the high frequency current supplied from the high frequency power supply unit 60 to the RF antenna 54 via the high frequency power supply line 62 was set to about 1 A. Moreover, the doughnut-shaped plasma generated by inductive coupling in the processing space in the chamber 10 which is positioned directly below the RF antenna 54 was plotted by a disc-shaped resistance 100 shown in FIG. 2. The diameter, the resistivity and the skin depth of the resistance 100 were set to about 500 mm, 100 Ωcm, and 10 mm, respectively. The frequency of the high frequency power $RF_H$ for plasma generation was set to about 13.56 MHz.

As shown in FIGS. 7A to 7D, in the third combination mode (1AT/1AT), the seventh combination mode (2AT/1AT), the fifth combination mode (2AT/0AT) and the sixth combination mode (0AT/2AT), the theoretical result was obtained from the simulation on the radial distribution of the current density in the doughnut-shaped plasma.

In the eight combination mode (1AT/2AT), the simulation result was different from the theoretical result. In other words, although it is theoretically expected that the current density is increased to a maximum value in accordance with 1 AT at the position directly below the central coil 54(1) (about 100 mm). However, according to the simulation result shown in FIG. 7E, the current density is considerably lower than the maximum value in accordance with 1 AT at the position directly below the central coil 54(1), and the maximum value corresponding to 2 AT which is higher than that in another combination mode is obtained at the position directly below the peripheral coil 54(2) (200 mm).

This is because when the peripheral coil 54(2) has a large diameter (radius greater than or equal to about 150 mm) and is adjusted to the multiplication series mode (2 AT) and further when the central coil 54(1) is adjusted to the parallel mode (1 AT) or the multiplication series mode (2 AT), the entire current path (effective length) in the RF antenna 54 is considerably increased. Further, a standing wave having current nodes is formed near the RF input terminal of the RF antenna 54, i.e., in the central coil 54(1), by the so-called wavelength effect.

Figure 8A:
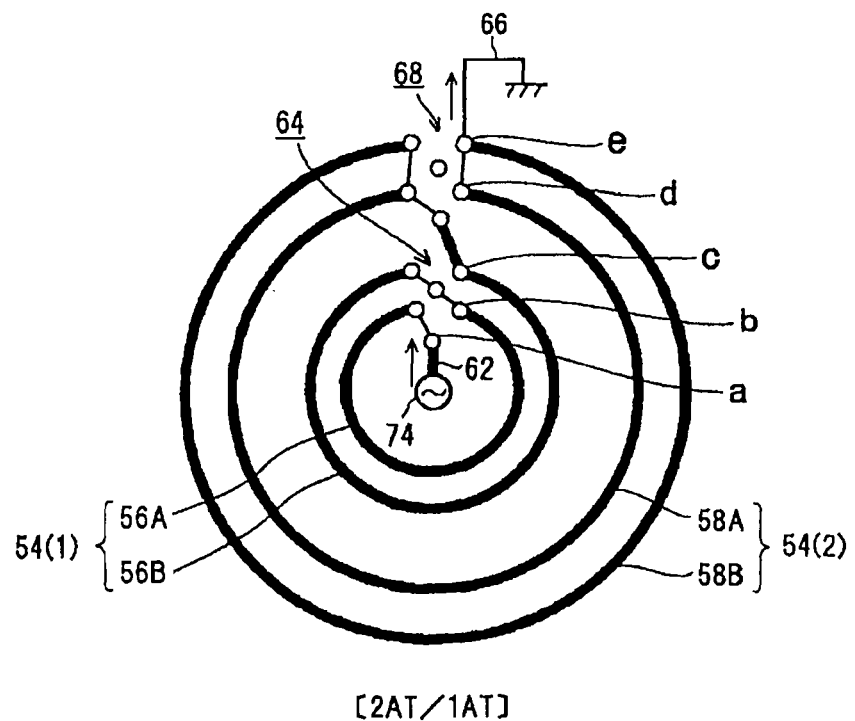
FIG. 8A shows representative points and a connection state in the RF antenna in a [2AT/1AT] combination mode.
Figure 8B:
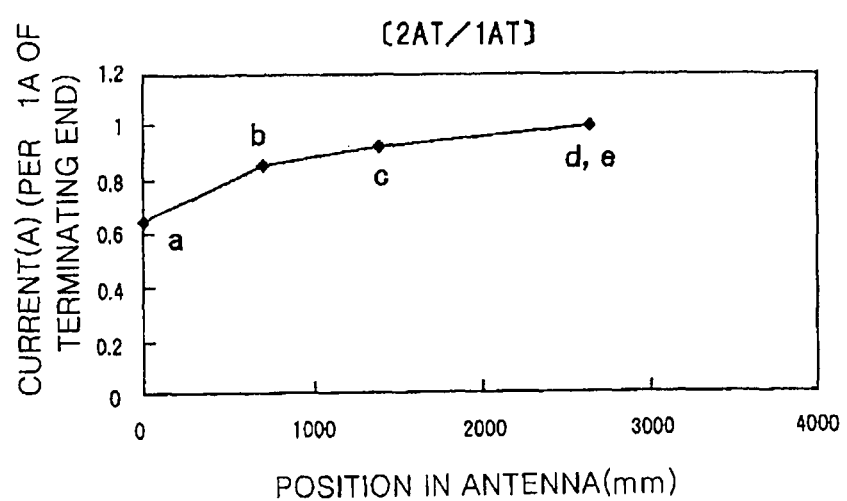
FIG. 8B is a plot diagram showing current distribution in the RF antenna in the [2AT/1AT] combination mode.
Figure 9A:
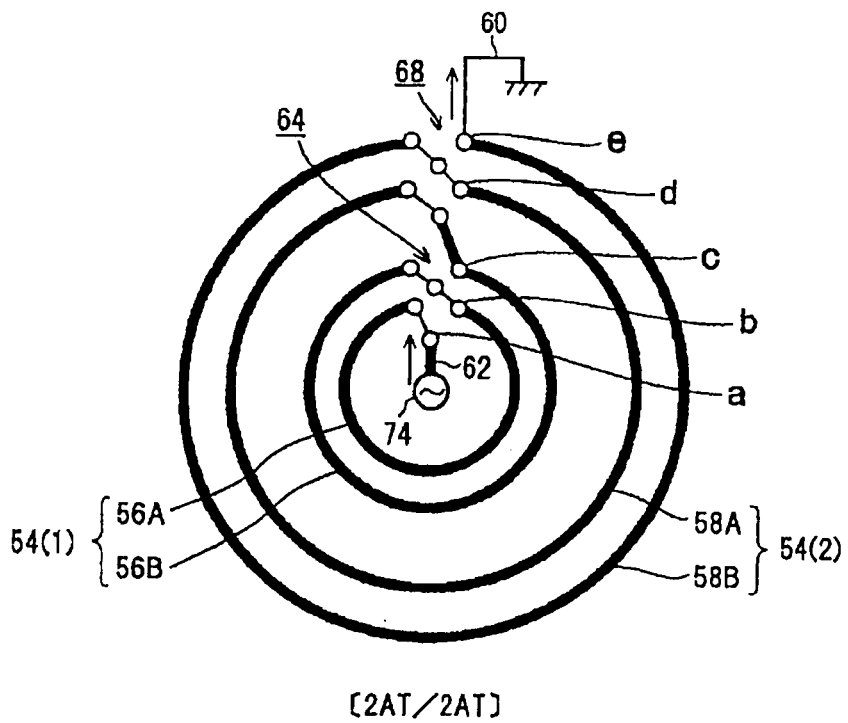
FIG. 9A shows representative points and a connection state in the RF antenna in a [2AT/2AT] combination mode.
Figure 9B:
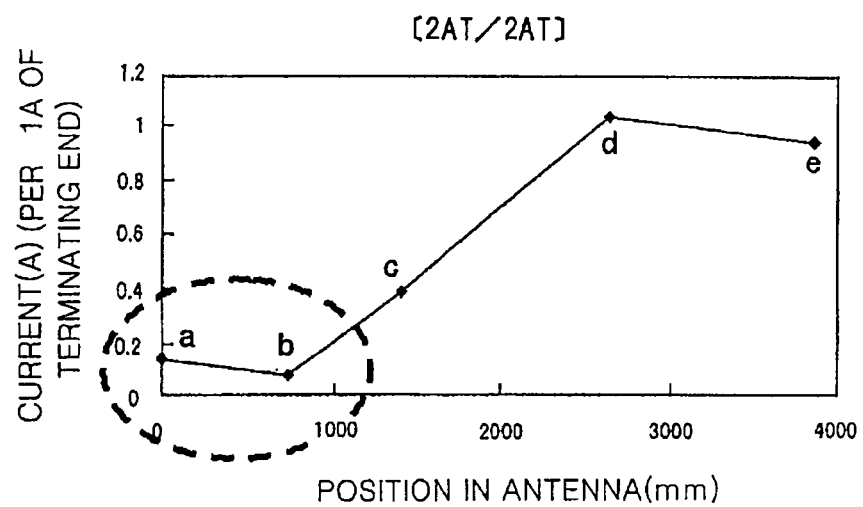
FIG. 9B is a plot diagram showing current distribution in the RF antenna in the [2AT/2AT] combination mode.

The present applicant obtained the high frequency currents at the representative points 'a' to 'e' in the RF antenna 54 and plotted the obtained high frequency currents. As a result, in the seventh combination mode (FIG. 8A), the current difference among the points is small, as shown in FIG. 8B. However, in the fourth combination mode (FIG. 9A) in which the entire current path (effective length) in the RF antenna 54 becomes maximum, the current is considerably decreased in a first half section of the central coil 54(1), as shown in FIG. 9B.

Further, in this simulation, the base point 'a' (0 mm) is set to the position of the terminal 88 serving as the RF entry point of the RF antenna 54; the point b is set to the other end of the inner coil segment 56A of the central coil 54(1); the point c is set to the other end of the outer coil segment 56B of the central coil 54(1); the point d is set to the other end of the inner coil segment 58A of the peripheral coil 54(2); and the point e is set to the other end (terminating end) of the outer coil segment 58B of the peripheral coil 54(2). In the current distribution plotted in FIGS. 8B and 9B, the position of each point is indicated by a distance of the current path from the base point (0 mm), and the current at each point is indicated by a relative value (ratio) with respect to the current at the terminating end point e (1 A: reference value).

In order to reduce the wavelength effect, it is preferable to employ a configuration in which a capacitor is installed at a proper location in the RF antenna 54.

Figure 10A:
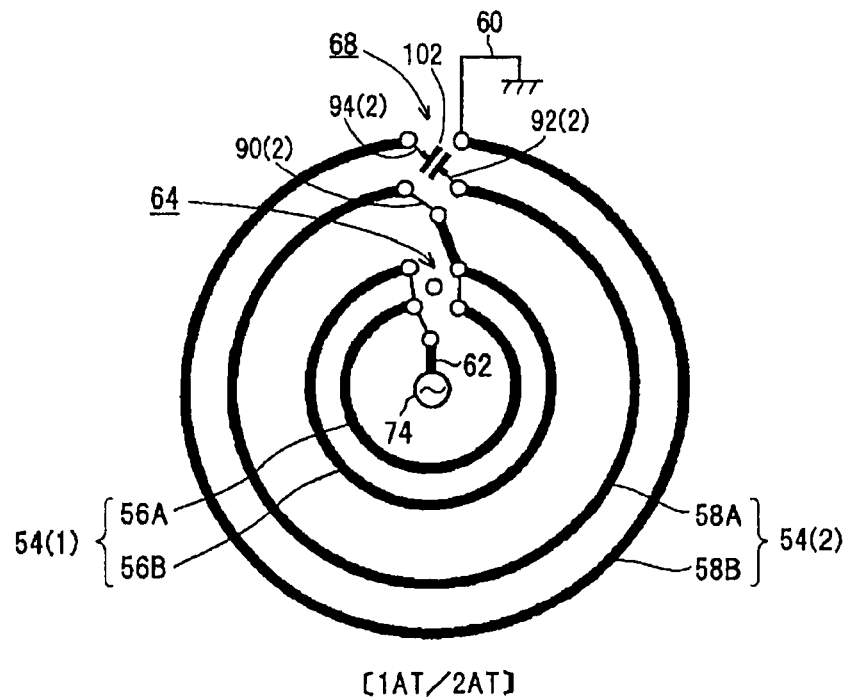
FIG. 10A shows the state of selecting a [1AT/2AT] combination mode in a configuration in which a capacitor is provided in the RF antenna.
Figure 10B:
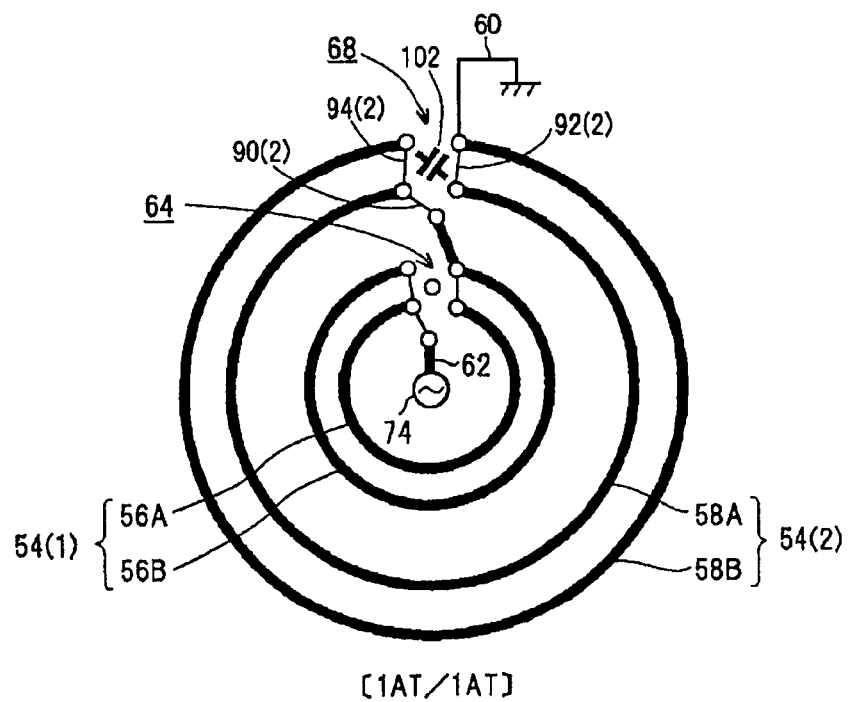
FIG. 10B shows the state of selecting a [1AT/1AT] combination mode in the configuration in which the capacitor is provided in the RF antenna.
Figure 10C:
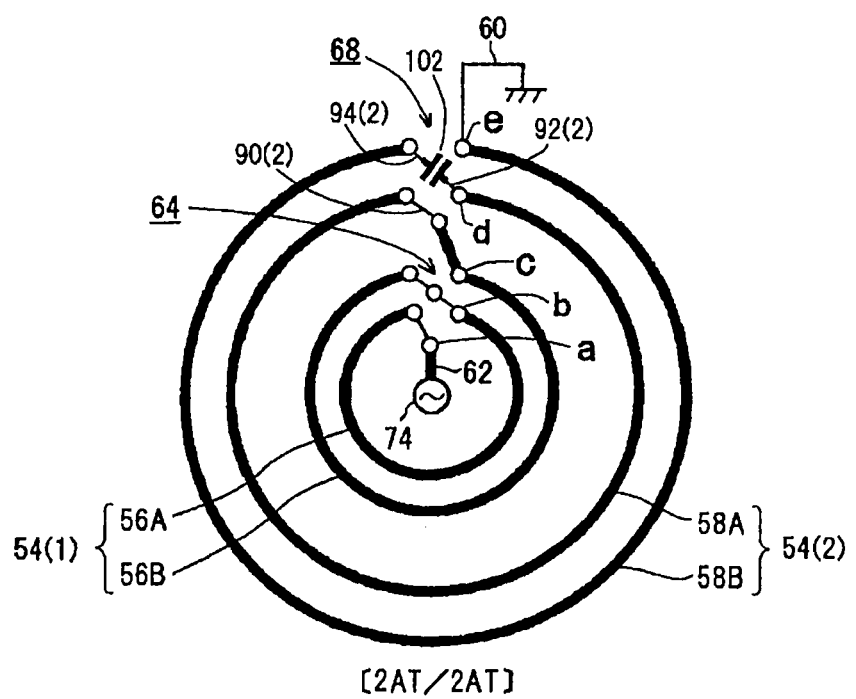
FIG. 10C shows the state of selecting the [2AT/2AT] combination mode in the configuration in which the capacitor is provided in the RF antenna.

In the configuration example shown in FIGS. 10A to 10C, a capacitor 102 is connectably disposed between the other end of the inner coil segment 58A and one end of the outer coil segment 58B of the peripheral coil 54(2).

In this case, in the second switching network 68, the second switch 92(2) can switch the other end of the inner coil segment 58A among a position connected to one terminal of the capacitor 102 (e.g., position shown in FIG. 10A), a position connected to the other end of the outer coil segment 58B (e.g., position shown in FIG. 10B), and a position disconnected from one terminal of the capacitor 102 and the other end of the outer coil segment 58B (not shown). Further, the third switch 94(2) can switch one end of the outer coil segment 58B between a position connected to the other terminal of the capacitor 102 (e.g., position shown in FIG. 10A) and a position connected to one end of the inner coil segment 58A (e.g., position shown in FIG. 10B).

Figure 10D:
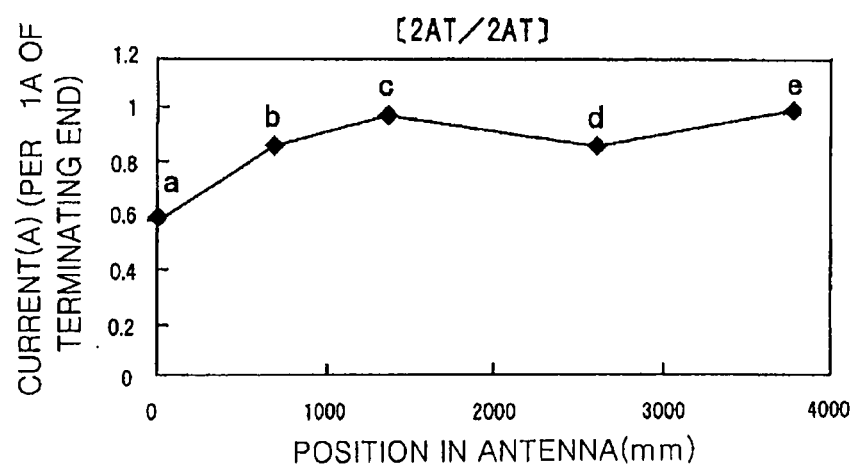
FIG. 10D is a plot diagram showing current distribution in the RF antenna in the case of selecting the [2AT/2AT] combination mode (FIG. 100)
Figure 10E:
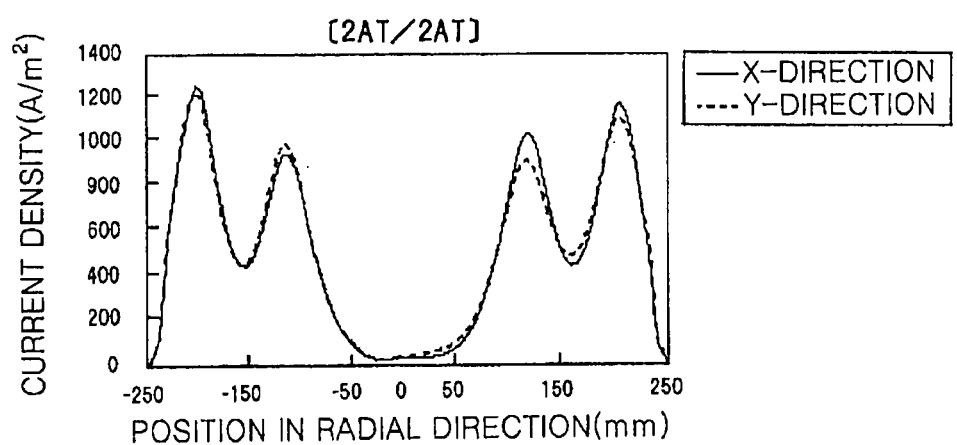
FIG. 10E shows current density distribution in a doughnut-shaped plasma in the case of selecting the [2AT/2AT] combination mode (FIG. 100)

The present applicant performed the simulation on the fourth combination mode (FIG. 10) in which the current path (effective length) in the RF antenna 54 is maximum. As a result, the non-uniformity (variation) of the current distribution in the antenna was remarkably improved as shown in FIG. 10D, and the radial current density distribution in the doughnut-shaped plasma was remarkably improved as shown in FIG. 10E.

Figure 11:
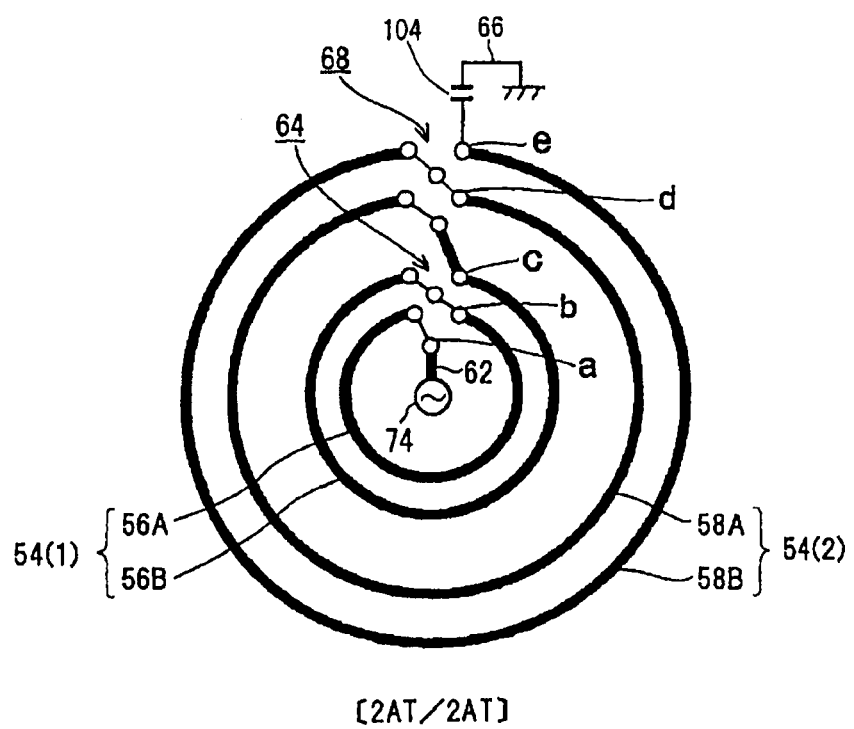
FIG. 11 shows the state of selecting the [2AT/2AT] combination mode in the configuration in which the capacitor is provided at the rear end of the RF antenna.

In another test example, the capacitor 104 may be connected in series between the exit point e of the RF antenna 54 and the RF ground wire 66 or in the middle of the RF ground wire 66, as can be seen from FIG. 11.

The present applicant performed the simulation on the fourth combination mode (FIG. 11) in which the current length (effective length) in the RF antenna 54 becomes maximum. As a result, the results shown in FIGS. 12A to 13B were obtained.

Figure 12A:
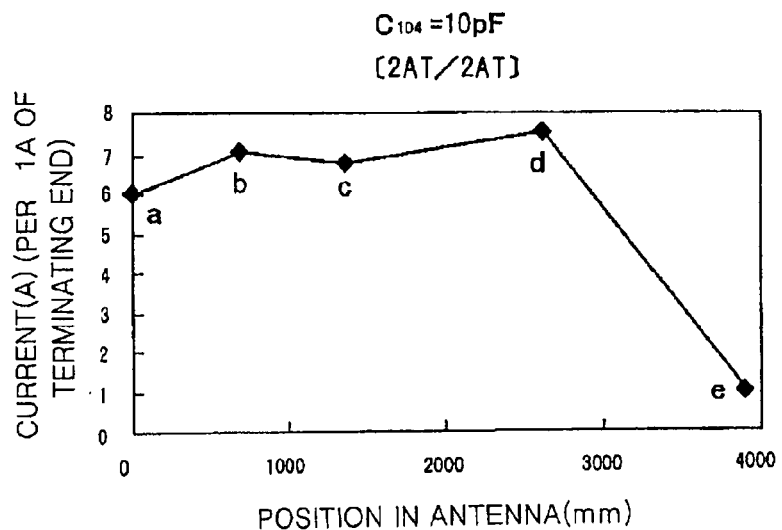
FIG. 12A is a plot diagram showing current distribution in the RF antenna in the case where a capacitor has a capacitance of about 10 pF in the [2AT/2AT] combination mode (FIG. 11)
Figure 12B:
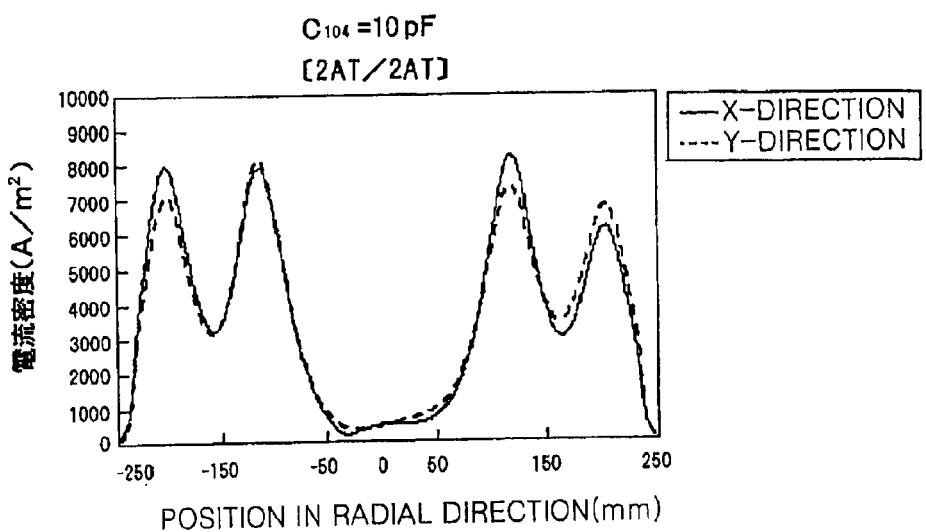
FIG. 12B shows current density distribution in a doughnut-shaped plasma in the case where a capacitor has a capacitance of about 10 pF in the [2AT/2AT] combination mode (FIG. 11)

In other words, when a capacitance $C_{104}$ of the capacitor 104 is set to about 10 pF, the current in the RF antenna 54 is substantially uniformly distributed in the central coil 54(1) at a level greater than the reference value 1 A by about six to seven times, and is sharply decreased toward the reference value (1 A) of the terminating end point e in the second half section of the peripheral coil 54(2), as can be seen from FIG. 12A. However, the profile of the radial distribution of the current density in the doughnut-shaped plasma is close to the theoretical profile, as shown in FIG. 12B.

Figure 7A:
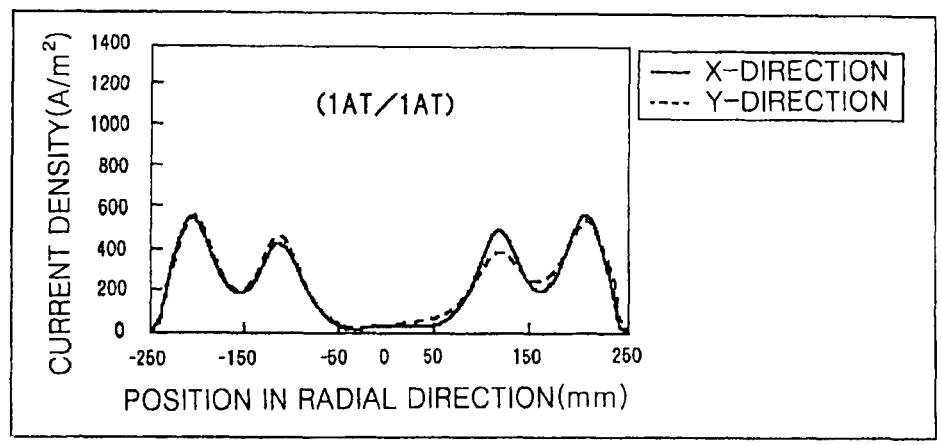
FIGS. 7A to 7E show current density distributions in a doughnut-shaped plasma obtained by electromagnetic field simulation in several combination modes in the first test example.
Figure 7B:
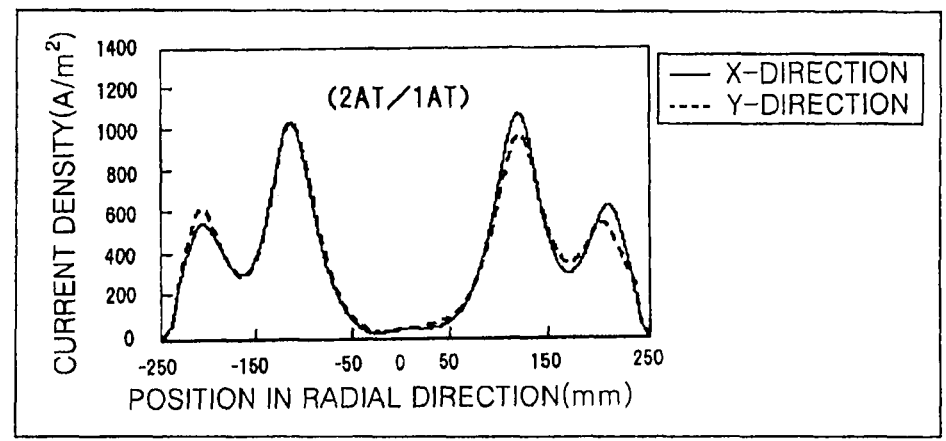
Figure 7C:
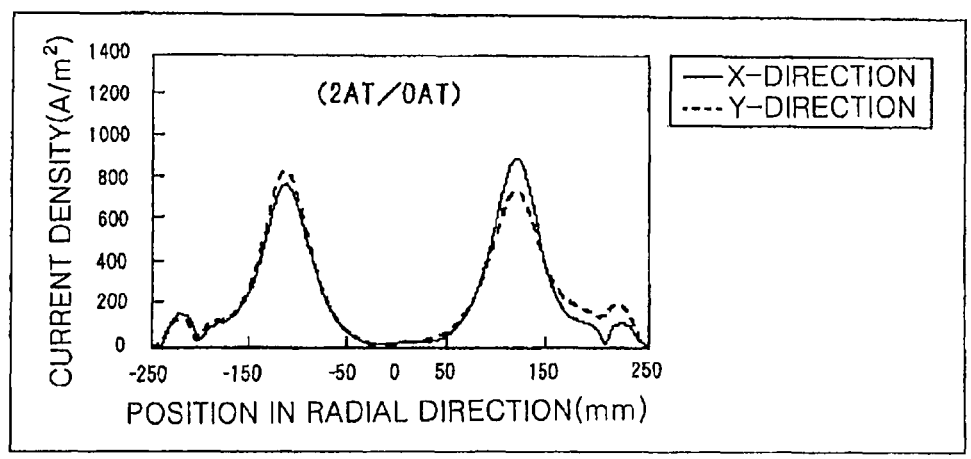
Figure 7D:
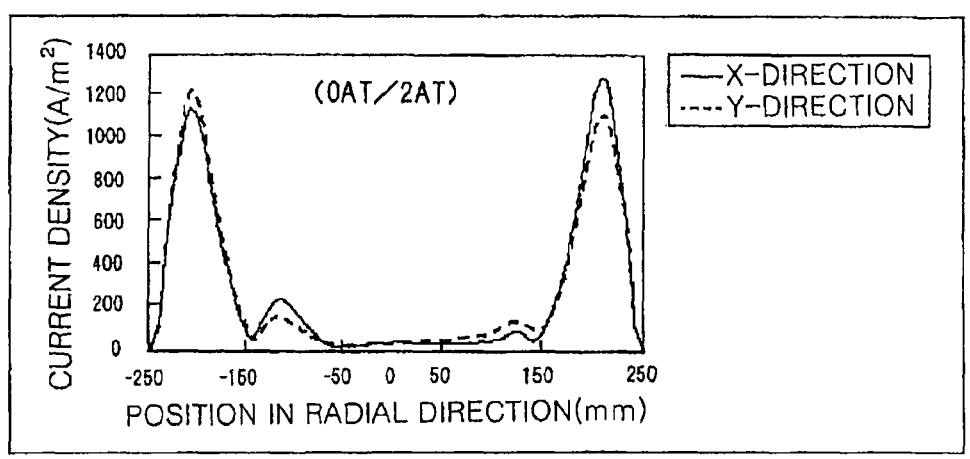
Figure 7E:
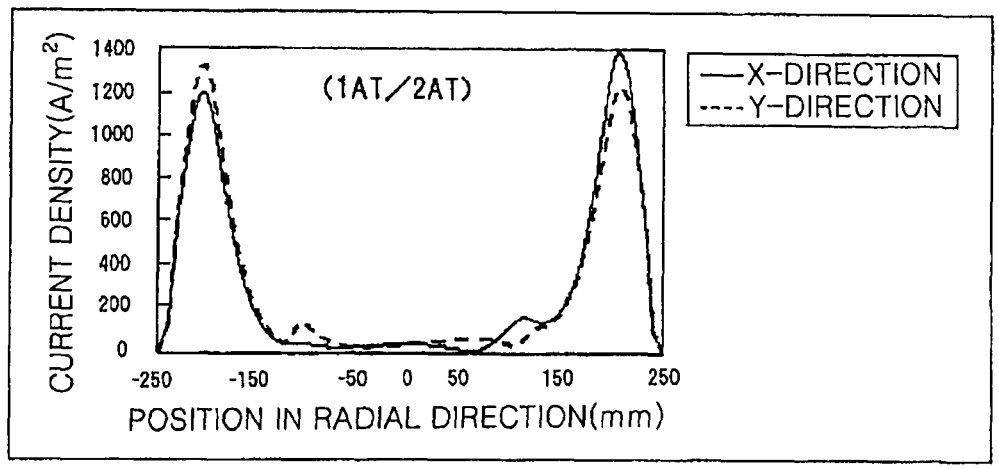
Figure 13A:
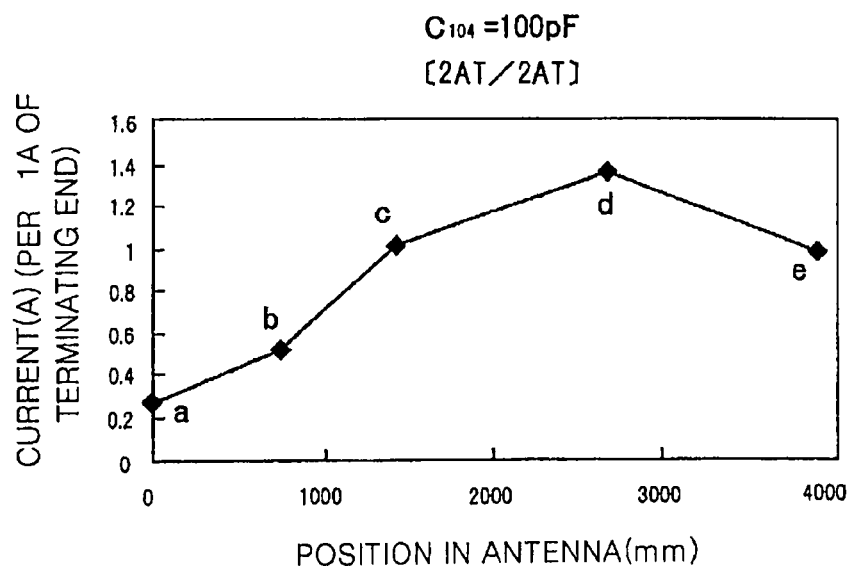
FIG. 13A is a plot diagram showing current distribution in the RF antenna in the case where a capacitor has a capacitance of about 100 pF in the [2AT/2AT] combination mode (FIG. 11)
Figure 13B:
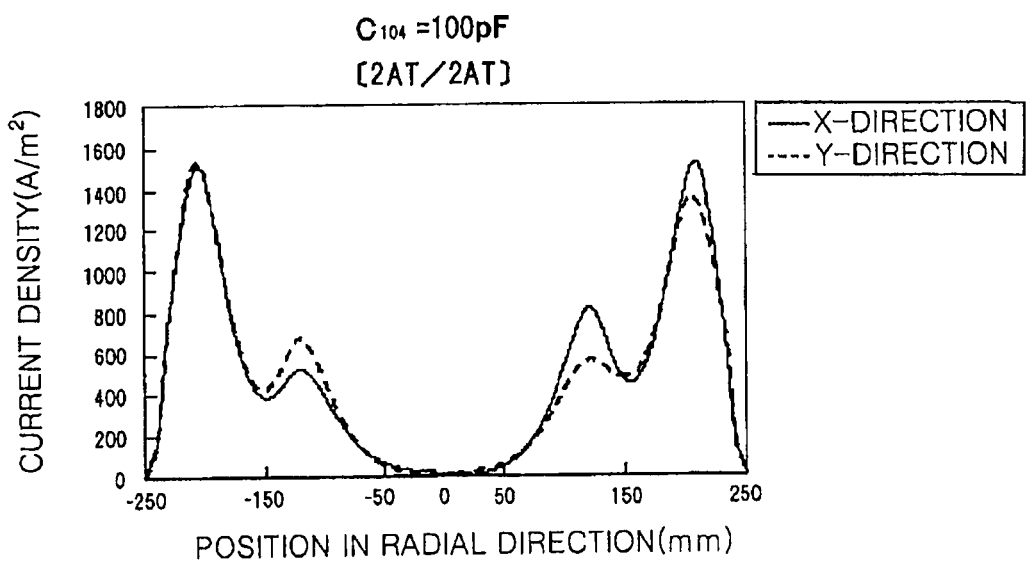
FIG. 13B shows current density distribution in a doughnut-shaped plasma in the case where a capacitor has a capacitance of about 100 pF in the [2AT/2AT] combination mode (FIG. 11)

When the capacitance $C_{104}$ of the capacitor 104 is set to about 100 pF, the current distribution in the RF antenna 54 has a profile in which the current smaller than the reference value (1 A) is decreased toward the starting end point a in the central coil 54(1) and the current greater than the reference value (1 A) is increased in a mountain shape in the peripheral coil 54(2), as shown in FIG. 13A. As shown in FIG. 13B, although the radial distribution of the current density in the doughnut-shaped plasma is different from the theoretical distribution, it is remarkably improved compared to when the capacitor 104 is not provided (FIG. 7E). A variable capacitor may be used for the capacitor 104.

As such, in the configuration in which the capacitor 104 is inserted in the RF antenna 54 or connected in series to the rear end of the antenna 54, the radial distribution of the current density in the doughnut-shaped plasma can have a profile close to a theoretical profile or can be corrected to have a desired profile regardless of the mode of the current path in the RF antenna 54 by controlling the capacitance $C_{104}$.

[RF Antenna and Switching Network in Second Test Example]

FIGS. 14 to 19 show configurations of an RF antenna and a switching network in a second test example.

The RF antenna 54 of this test example is divided in a radial direction into the central and the peripheral coil 54(1) and 54(2), and each of the coils 54(1) and 54(2) is divided into a right coil and a left coil.

More specifically, the primary coil 54(1) includes a first and a second arc-shaped (preferably, semicircular) coil segment 110A and 110B positioned at the central portion of the RF antenna 54 and extending in parallel to each other, and a third and a fourth arc-shaped (preferably, semicircular) coil segment 110C and 110D extending in parallel to each other along the circumferences of the first and the second coil segment 110A and 110B. Here, the first and the third coil segment 110A and 110C are radially inner coil segments, and the second and the fourth coil segment 110B and 110D are radially outer coil segments.

The first and the second coil segment 110A and 110B extend in parallel to each other in an arc shape with an extremely small predetermined gap $g_1$ (preferably smaller than a skin depth δ) therebetween in one half area of the antenna (left half area in the drawing) at a uniform radius, thereby forming semicircular coils. The third and the fourth coil segment 110C and 110D extend in parallel to each other in an arc shape with an extremely small predetermined gap $g_1$ (preferably smaller than a skin depth δ) therebetween in the other half area of the antenna (right half area in the drawing) at a uniform radius, thereby forming semicircular coils. Preferably, the coil segments 110A, 110B, 110C and 110D may have the same wire material and the same thickness (cross sectional area), and the impedances thereof are similar to each other.

Meanwhile, the secondary coil 54(2) is positioned at the peripheral portion of the RF antenna 54, and includes a fifth and a sixth arc-shaped (preferably, semicircular) coil segment 112A and 112B extending in parallel to each other and a seventh and an eighth arc-shaped (preferably, semicircular) coil segment 112C and 112D extending in parallel to each other along the circumferences of the fifth and the sixth coil segment 112A and 112B. Here, the fifth and the seventh coil segment 112A and 112C are radially inner coil segments, and the sixth and the eighth coil segment 112B and 112D are radially outer coil segments.

The fifth and the sixth coil segment 112A and 112B extend in an arc shape in parallel to each other with an extremely small predetermined gap $g_2$ (preferably smaller than a skin depth δ) therebetween in one half area of the antenna (left half area in the drawing) at a uniform radius, thereby forming semicircular coils. The seventh and the eighth coil segment 112C and 112D extend in an arc shape in parallel to each other with an extremely small predetermined gap $g_2$ (preferably smaller than a skin depth δ) therebetween in the other half area of the antenna (right half area in the drawing) at a uniform radius, thereby forming semicircular coils. Preferably, the coil segments 112A, 112B, 112C and 112D may have the same wire material and the same thickness (cross sectional area), and the impedances thereof are similar to each other.

In the case of the central coil 54(1), in the coil circling direction, one ends of the first and the third coil segment 110A and 110C are close to each other via a gap; the other ends of the first and the third coil segment 110A and 110C are close to each other via a gap; one ends of the second and the fourth coil segment 110B and 110D are close to each other via a gap;

and the other ends of the second and the fourth coil segment 110B and 110D are close to each other via a gap.

In the horizontal direction (coil radial direction) perpendicular to the coil circling direction, one ends of the first and the second coil segment 110A and 110B are close to each other via a gap; the other ends of the first and the second coil segment 110A and 110B are close to each other via a gap; one ends of the third and the fourth coil segment 110C and 110D are close to each other via a gap; and the other ends of the third and the fourth coil segment 110C and 110D are close to each other via a gap.

In the case of the peripheral coil 54(2), in the coil circling direction, one ends of the fifth and the seventh coil segment 112A and 112C are close to each other via a gap; the other ends of the fifth and the seventh coil segment 112A and 112C are close to each other via a gap; one ends of the sixth and the eighth coil segment 112B and 112D are close to each other via a gap; and the other ends of the sixth and the eighth coil segment 112B and 112D are close to each other via a gap.

In the horizontal direction (coil radial direction) perpendicular to the coil circling direction, one ends of the fifth and the sixth coil segment 112A and 112B are close to each other via a gap; the other ends of the fifth and the sixth coil segment 112A and 112B are close to each other via a gap; one ends of the seventh and the eighth coil segment 112C and 112D are close to each other via a gap; and the other ends of the seventh and the eighth coil segment 112C and 112D are close to each other via a gap.

In this test example, a first switching network 114 is provided for the central coil 54(1), and a second switching network 115 is provided for the peripheral coil 54(2).

Hereinafter, the configuration and operation of the first switching network 114 will be described. The first switching network 114 includes a first to a sixth switch 116(1), 118(1), 120(1), 122(1), 124(1) and 126(1).

Figure 14A:
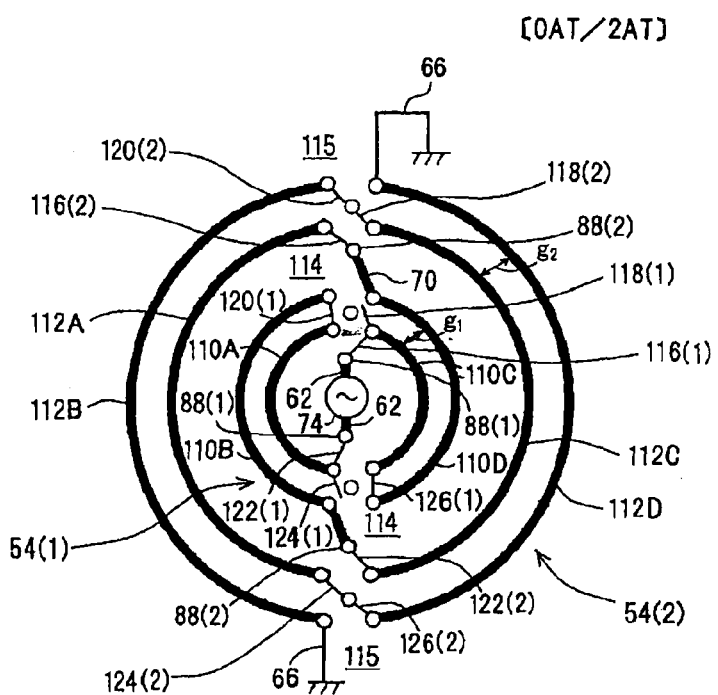
FIG. 14A shows the state of selecting a [0AT/2AT] combination mode in a second test example.
Figure 14B:
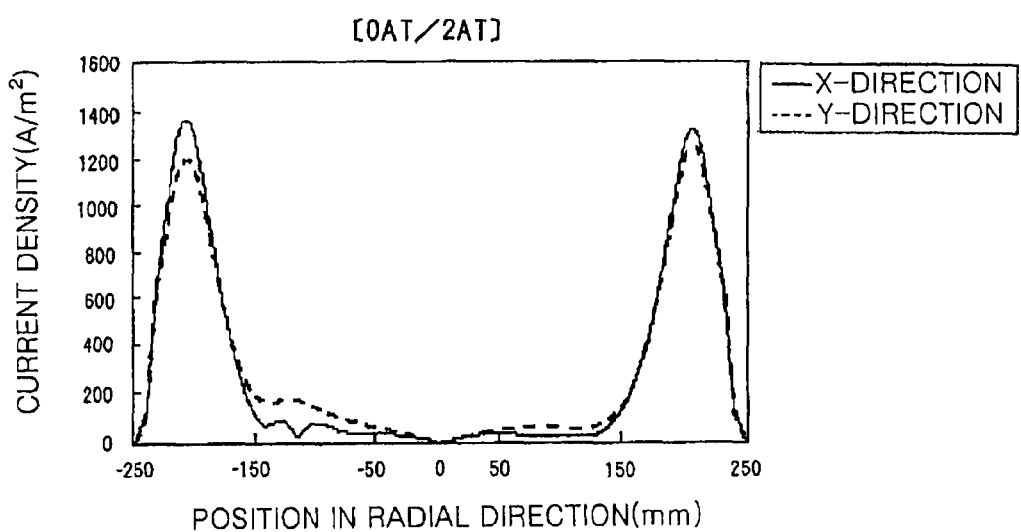
FIG. 14B shows current density distribution in a doughnut-shaped plasma in the case of selecting the [0AT/2AT] combination mode (FIG. 14A)

The first switch 116(1) can switch the first terminal 88(1) positioned at the terminating end of the high frequency power supply line 62 from the high frequency power supply unit 60 between a position connected to one end of the first coil segment 110A (FIGS. 15A and 19A) and a position connected to one end of the third coil segment 110C (FIG. 14A).

The second switch 118(1) can switch one end of the third coil segment 110C among a position connected to one end of the fourth coil segment 110D (FIGS. 15A and 19A), a position connected to one end of the second coil segment 110B (FIGS. 16A to 18A), and a position disconnected from one end of the fourth coil segment 110D and one end of the second coil segment 110B (FIG. 14A).

Figure 15A:
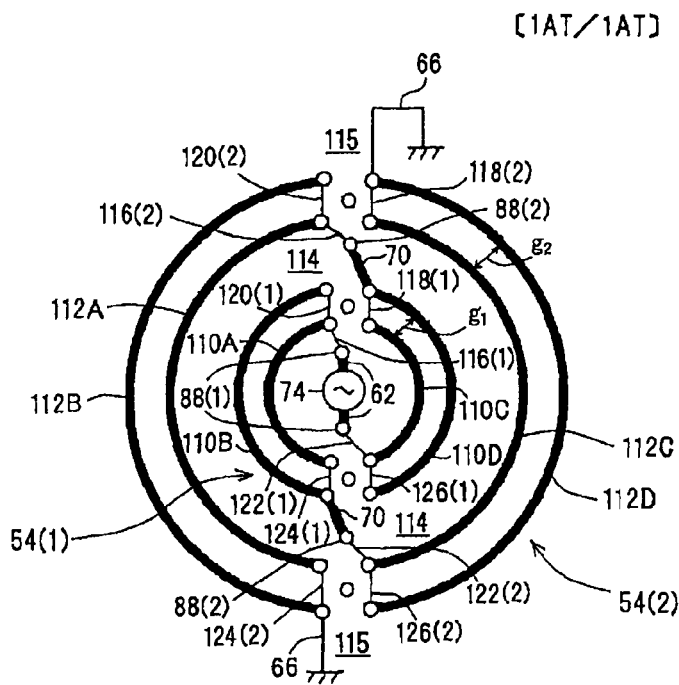
FIG. 15A shows the state of selecting the [1AT/2AT] combination mode in the second test example.
Figure 15B:
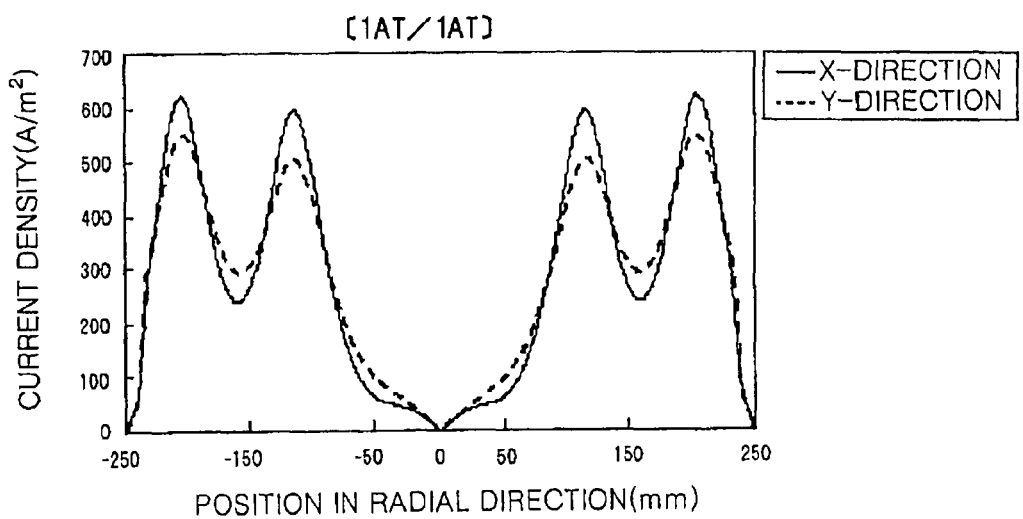
FIG. 15B shows current density distribution in a doughnut-shaped plasma in the case of selecting the [1AT/1AT] combination mode (FIG. 15A)
Figures 16A, 16B:
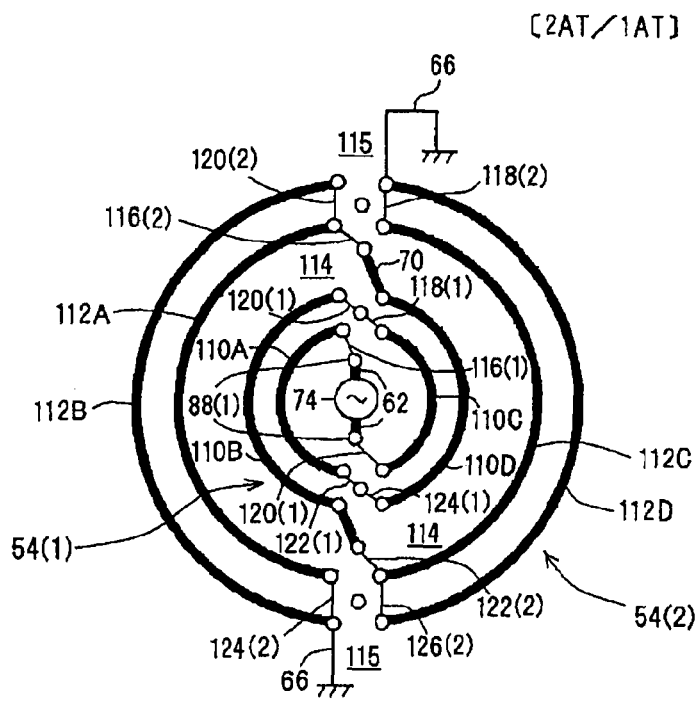
FIG. 16A shows the case of selecting the [2AT/1AT] combination mode in the second test example.
FIG. 16B shows current density distribution in a doughnut-shaped plasma in the case of selecting the [2AT/1AT] combination mode (FIG. 16A)
Figure 18A:
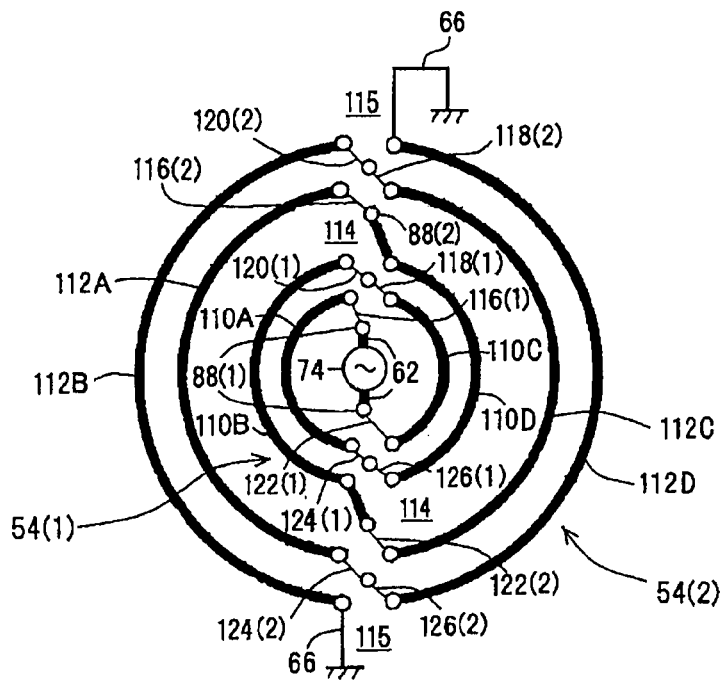
FIG. 18A shows the state of selecting the [2AT/2AT] combination mode in the second test example.
Figure 18B:
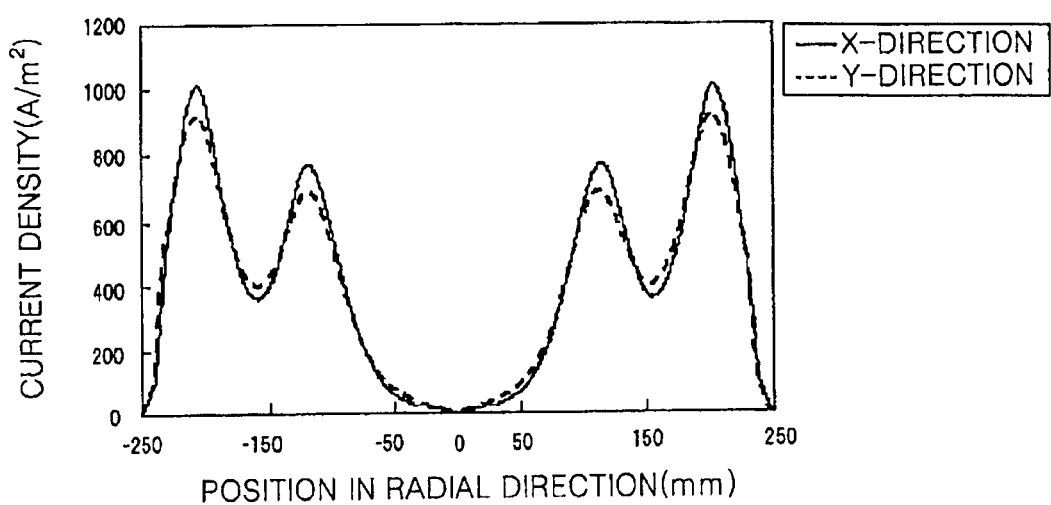
FIG. 18B shows current density distribution in a doughnut-shaped plasma in the case of selecting the [2AT/2AT] combination mode (FIG. 18A)

The third switch 120(1) can switch one end of the second coil segment 110B between a position connected to one end of the first coil segment 110A (FIGS. 14A, 15A and 19A) and a position connected to one end of the third coil segment 110C (FIGS. 16A and 18A).

Figure 19A:
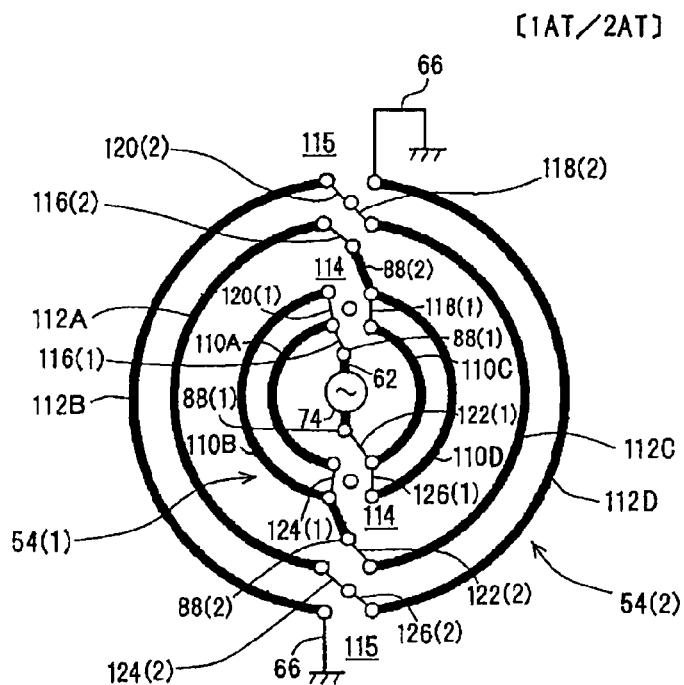
FIG. 19A shows the state of selecting the [1AT/2AT] combination mode in the second test example.
Figure 19B:
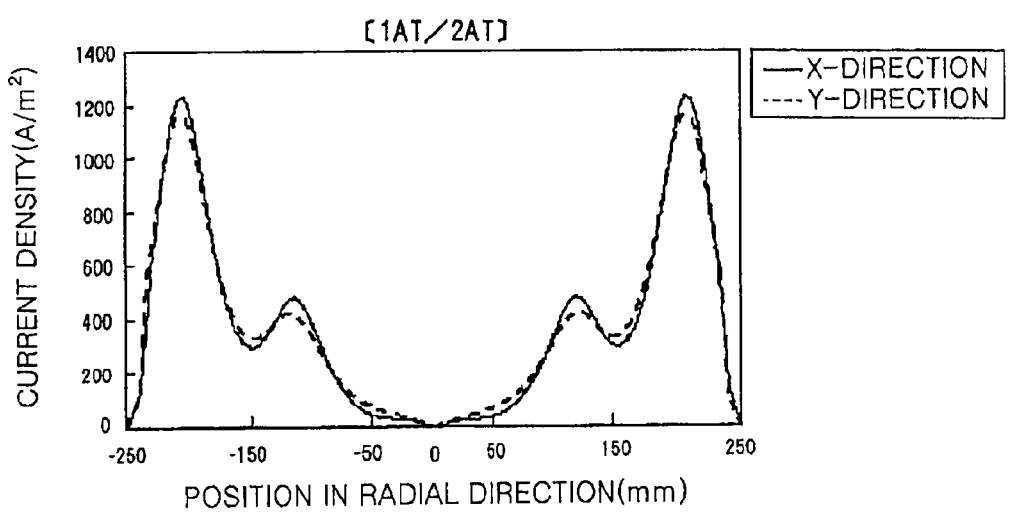
FIG. 19B shows current density distribution in a doughnut-shaped plasma in the case of selecting the [1AT/2AT] combination mode (FIG. 19A)
Figure 22A:
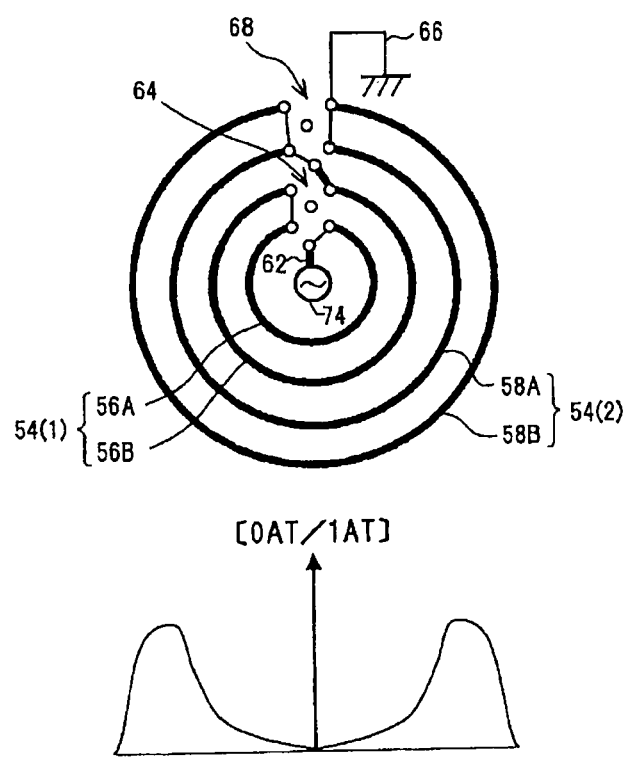
FIG. 22A shows current density distribution in a doughnut-shaped plasma and a connection state of each unit in the case of selecting a [0AT/1AT] combination mode in a test example in which a gap between a pair of coil segments in both of the central and the peripheral coil is increased.
Figure 22B:
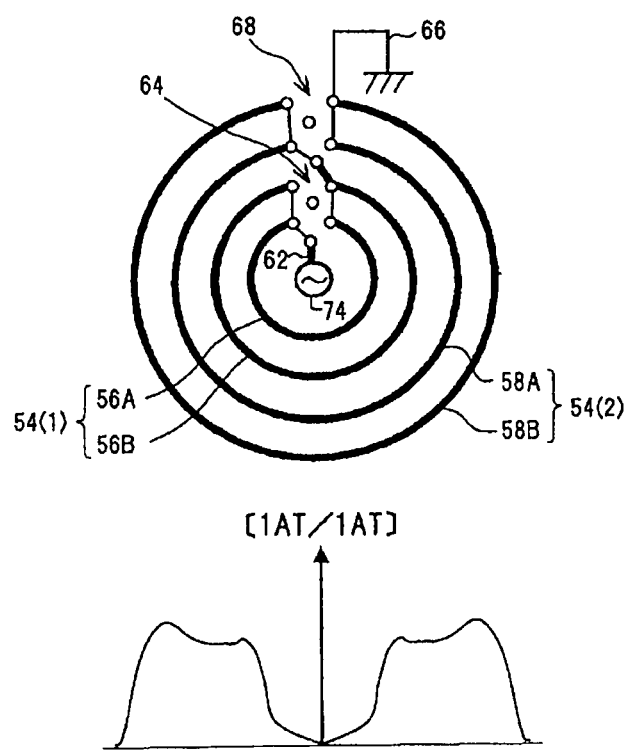
FIG. 22B shows current density distribution in a doughnut-shaped plasma and a connection state of each unit in the case of selecting the [1AT/1AT] combination mode in the test example.
Figure 22C:
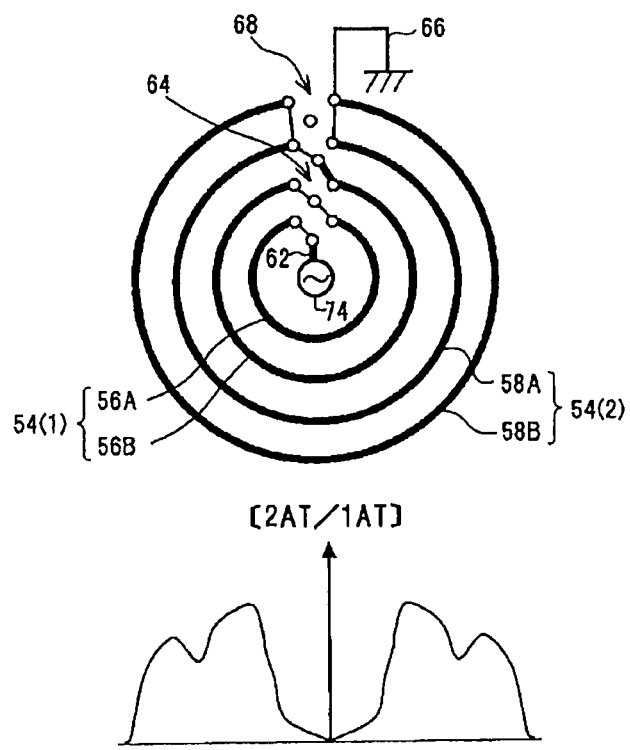
FIG. 22C shows current density distribution in a doughnut-shaped plasma and a connection state of each unit in the case of selecting the [2AT/1AT] combination mode in the test example.
Figure 22D:
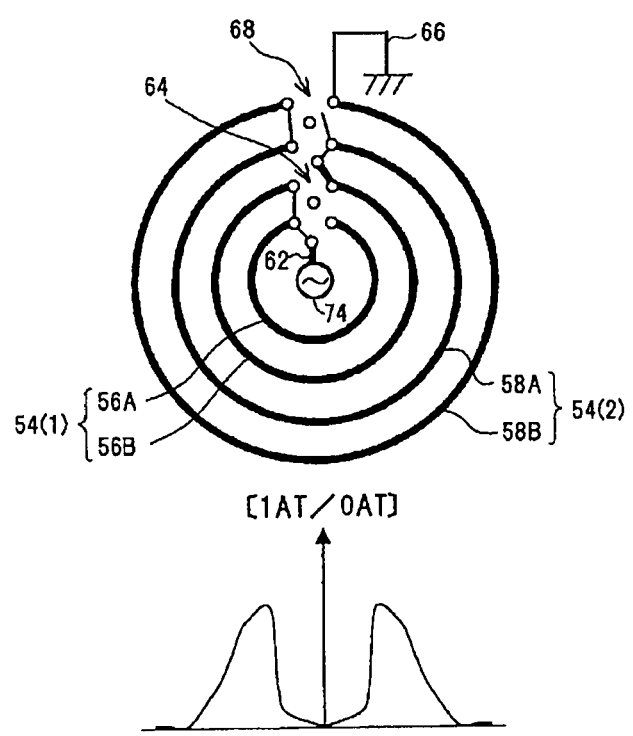
FIG. 22D shows current density distribution in a doughnut-shaped plasma and a connection state of each unit in the case of selecting the [1AT/0AT] combination mode in the test example.

The fourth switch 122(1) can switch the first terminal 88(1) between a position connected to the other end of the first coil segment 110A (FIG. 14A) and a position connected to the other end of the third coil segment (FIGS. 15A and 19A).

The fifth switch 124(1) can switch the other end of the first coil segment 110A among a position connected to the other end of the fourth coil segment 110D (FIGS. 16A to 18A), a position connected to the other end of the second coil segment 110B (FIGS. 15A and 19A), and a position disconnected from the other end of the fourth coil segment 110D and the other end of the second coil segment 110B (FIG. 14A).

The sixth switch 126(1) can switch the other end of the fourth coil segment 110D between a position connected to the other end of the first coil segment 110A (FIGS. 16A to 18A) and a position connected to the other end of the third coil segment (FIGS. 14A, 15A and 19A).

Preferably, each of the first to the sixth switch 116(1) to 126(1) is formed of a vacuum switch or a vacuum relay, and is switched by an individual switch driving circuit (not shown) under the control of the control unit 86. Depending on the combination types of the switching positions of the six switches 116(1) to 126(1), the connection type among the first to the fourth coil segment 110A to 110D (i.e., the current path in the central coil 54(1)) can be adjusted to the three modes including the parallel mode of FIGS. 15A and 19A, the multiplication series mode of FIGS. 16A to 18A, and the minimization series mode of FIG. 14A.

Here, in the parallel mode (FIGS. 15A and 19A), the high frequency branch currents I/2 and I/2 flow through the first and the second coil segment 110A and 110B in the positive direction (clockwise direction in the drawing) in the left half region of the antenna, and the high frequency branch currents I/2 and I/2 flow through the third and the fourth coil segment 110C and 110D in the positive direction in the right half region of the antenna. Thus, the combined electromotive force of the entire central coil 54(1) becomes about 1 AT.

In the multiplication series mode (FIGS. 16A to 18A), the high frequency current I flows through the first and the second coil segment 110A and 110B in the positive direction in the left half region of the antenna, and the high frequency current I flows through the third and the fourth coil segment 110C and 110D in the positive direction in the right half region of the antenna. Therefore, the combined electromotive force of the entire central coil 54(1) becomes 2 AT.

In the minimization series mode (FIG. 14A), the high frequency current I flows through the first coil segment 110A in the negative direction (clockwise direction) and through the second coil segment 110B in the positive direction (counterclockwise direction) in the left half area of the antenna. Further, the high frequency current I flows through the third coil segment 110C in the negative direction (clockwise direction) and through the fourth coil segment 110D in the positive direction (counterclockwise direction) in the right half area of the antenna. Therefore, the electromotive force is minimized between the first coil segment 110A and the second coil segment 110B, and the electromotive force is minimized between the third coil segment 110C and the fourth coil segment 110D. Accordingly, the combined electromotive force of the entire central coil 54(1) becomes 0 AT.

The second switching network 115 has the same configuration and function as those of the first switching network 114. In other words, the second switching network 115 has a seventh to a twelfth switch 116(2), 118(2), 120(2), 122(2), 124(2) and 126(2).

Figure 17A:
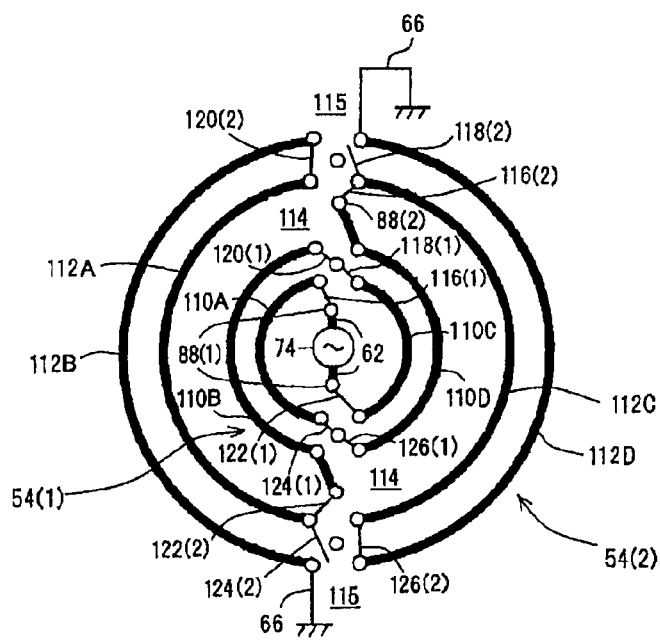
FIG. 17A shows the state of selecting a [2AT/0AT] combination mode in the second test example.
Figure 17B:
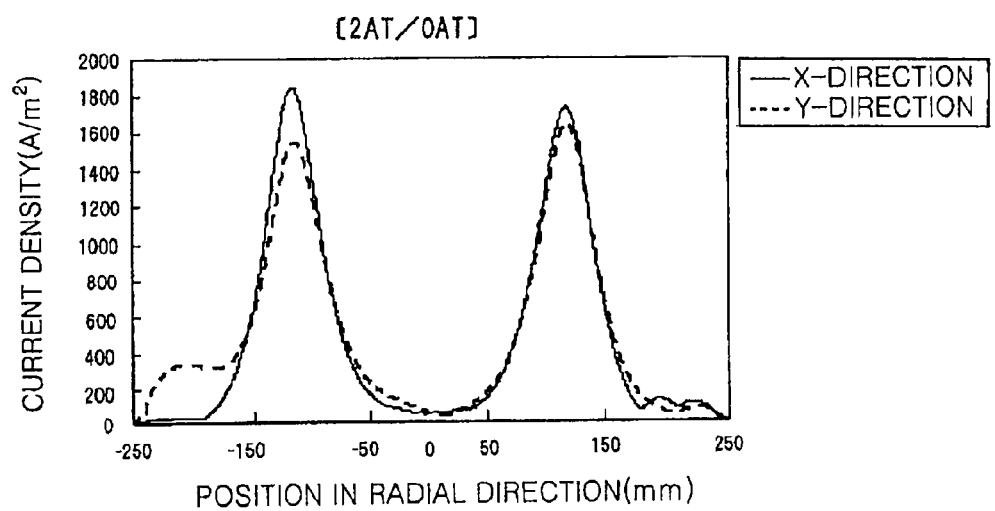
FIG. 17B shows current density distribution in a doughnut-shaped plasma in the case of selecting the [2AT/0AT] combination mode (FIG. 17A)

The seventh switch 116(2) can switch the conductive terminal (first terminal) 88(2) connected or connectable to the high frequency power supply line 62 via the central coil 54(1) between a position connected to one end of the fifth coil segment 112A (FIGS. 14A to 16A, 18A and 19A) and a position connected to one end of the seventh coil segment 112C (FIG. 17A).

The eighth switch 118(2) can switch one end of the seventh coil segment 112C among a position connected to one end of the eighth coil segment 112D (FIGS. 15A and 16A), a position connected to one end of the sixth coil segment 112B (FIGS. 14A, 18A and 19A) and a position disconnected from one end of the eighth coil segment (112D) and one end of the sixth coil segment 112B (FIG. 17A).

The ninth switch 120(2) can switch one end of the sixth coil segment 112B between a position connected to one end of the fifth coil segment 112A (FIGS. 15A and 17A) and a position connected to one end of the seventh coil segment 112C (FIGS. 14A, 18A and 19).

The tenth switch 122(2) can switch the first terminal 88(2) between a position connected to the other end of the fifth coil segment 112A (FIG. 17A) and a position connected to the other end of the seventh coil segment 112C (FIGS. 14A to 16A, 18A and 19A).

The eleventh switch 124(2) can switch the other end of the fifth coil segment 112A among a position connected to the other end of the sixth coil segment 112B (FIGS. 15A and 16A), a position connected to the other end of the eight coil segment 112D (FIGS. 14A, 18A and 19A), and a position disconnected from the other end of the sixth coil segment 112B and the other end of the fourth coil segment 112B (FIG. 17A).

The twelfth switch 126(2) can switch the other end of the eight coil segment 112D between a position connected to the other end of the seventh coil segment 112C (FIGS. 15A to 17A) and a position connected to the other end of the fifth coil segment 112A (FIGS. 14A, 18A and 19).

Preferably, the seventh to the twelfth switch 116(2) to 126(2) is formed of a vacuum switch or a vacuum relay, and is switched by an individual switch driving circuit (not shown) under the control of the control unit 86. Depending on the combination types of the switching positions of the six switches 116(2) to 126(2), the connection type among the fifth to the eight coil segment 112A-112D (i.e., the current path in the peripheral coil 54(2)) can be adjusted to the three modes including the parallel mode of FIGS. 15A and 16A, the multiplication series mode of FIGS. 14A, 18A and 19, and the minimization series mode of FIG. 17A.

As such, in this test example as well, the current path (current distribution) in each of the central coil 54(1) and the peripheral coil 54(2) can be switched among three modes (parallel mode, multiplication series mode and minimization series mode) by the first and the second switching network 114 and 115, and the combined electromotive force of the coils 54(1) and 54(2) can be adjusted to three levels (0 AT, 1 AT and 2 AT). Accordingly, the combined electromotive force or the current path (current distribution) in the RF antenna 54 can be adjusted to nine (3×3) combination modes.

The present applicant calculated the current density distribution in the doughnut-shaped plasma by performing the electromagnetic simulation on this test example. As a result, the profiles of FIGS. 14B to 19B were obtained in the combination modes of FIGS. 14A to 19A. As illustrated, the simulation result close to the theoretical result was obtained in each mode, especially in the [1AT/2AT] and [2AT/2AT] combination mode in which the current path (effective length) in the RF antenna 54 is considerably increased.

As such, in this test example, the length of each of the coil segments 110A to 112D forming the RF antenna 54 is reduced substantially to a half, so that the wavelength effect is reduced. Moreover, both of the central and the peripheral coil 54(1) and 54(2) have two open ends (symmetrical positions) for electromagnetic induction coupling with the plasma, so that the variation in the electron density distribution in the coil circling direction is reduced.

[RF Antenna and Switching Network in Another Test Example]

Although the test examples of the RF antenna and the switching network which can be assembled to the inductively coupled plasma etching apparatus of the present embodiment have been described, the present invention is not limited to the above test examples and can be variously modified without departing from the scope of the invention.

For example, in the RF antenna 54 of the first test example, the coil segments 56A and 56B forming the central coil 54(1) or the coil segments 58A and 58B forming the peripheral coil 54(2) may be a multi (at least two)-wound coil without being limited to a single-wound coil.

Preferably, the coil segments 56A and 56B are parallel to each other with a predetermined gap $g_1$ therebetween, and the coil segments 58A and 58B are parallel to each other with a predetermined gap $g_2$ therebetween. However, the degree of parallelism therebetween may be decreased.

Although it is not illustrated, a random coil can be provided in series between the high frequency power supply line 62 and the central coil 54(1), between the central coil 54(1) and the peripheral coil 54(2), or between the peripheral coil 54(2) and the RF ground wire 66.

Further, as shown in FIGS. 20A to 20C, either the central coil 54(1) or the peripheral coil 54(2), e.g., the peripheral coil 54(2), can be configured as, e.g., a single-wound coil segment 130. In that case, the current path (current distribution) in the central coil 54(1) can be switched among three modes (parallel mode, multiplication series mode and minimization series mode) by the first switching network 64, whereas the current path (current distribution) in the peripheral coil 54(2) is fixed to the single mode of the electromotive force [1AT]. Although it is not illustrated, the central coil 54(1) can be configured as, e.g., a single-wound coil segment.

As shown in FIGS. 21A to 21C, the gap $g_1$ between the coil segments 56A and 56B of the central coil 54(1) can be increased. In that case, as illustrated, it is difficult to perform a dipole control of the central coil 54(1) and the peripheral coil 54(2) fluctuatingly thereof in the current density distribution in the doughnut-shaped plasma.

As shown in FIGS. 22A to 22E, the gap $g_1$ between the coil segments 56A and 56B and the gap $g_2$ between the coil segments 58A and 58B of the central coil 54(1) and the peripheral coil 54(2) of the RF antenna 54 can be increased.

FIGS. 22A to 22E respectively show the [0AT/1AT] combination mode, the [1AT/1AT] combination mode, the [2AT/1AT] combination mode, the [1AT/0AT] combination mode, and the [1AT/2AT] combination mode. As illustrated, the electromotive force (i.e., the radial current density distribution) can be variably controlled by switching the mode. However, in the current density distribution in the doughnut-shaped plasma that is obtained by each combination mode, the fluctuation in the dipole control of the central coil 54(1) and the peripheral coil 54(2) is decreased.

For example, when the coil segments 56A and 56B forming the primary coil are separated from each other, the impedance difference therebetween is increased considerably, and the current flowing through the inner coil segment 56A having a small impedance becomes higher than the current flowing through the outer coil segment 56B having a large impedance. Further, the distribution ratio is affected by the plasma state, and the combined electromotive force in each mode is changed.

Therefore, in the RF antenna of the present invention, it is preferable to minimize the distance between the coil segments forming the primary coil such that the impedances thereof become similar to each other. To do so, it is preferable to set the gap between the coil segments to be smaller than or equal to the skin depth. However, it is practically sufficient that a ratio of an diameter (e.g. inner diameter) of the inner coil segment to an diameter (inner diameter) of the outer coil segment is set to be greater than or equal to about 80%.

Figure 23:
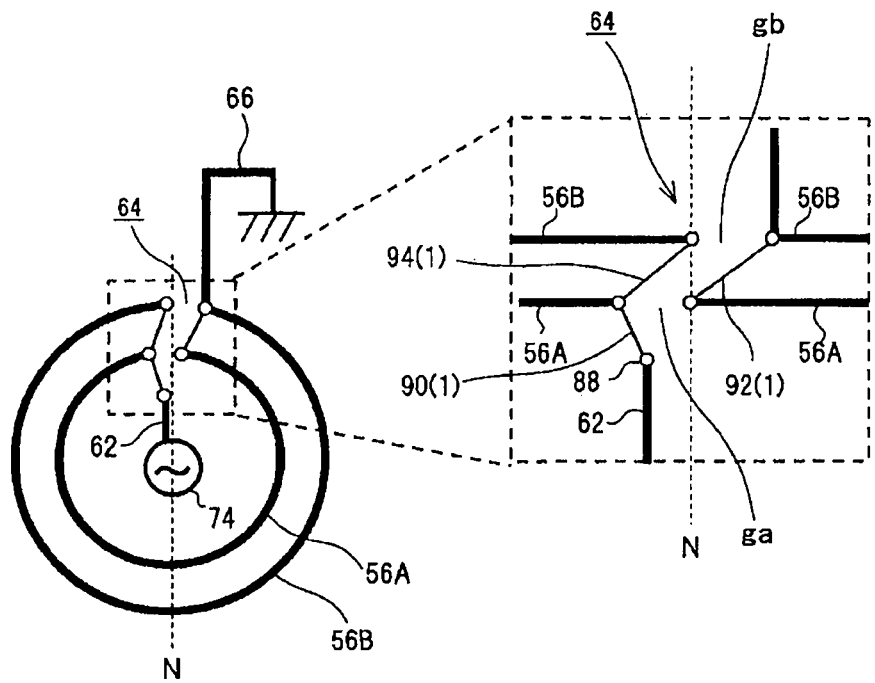
FIG. 23 shows a test example in which a gap between terminals (open ends) of a pair of coil segments forming a couple of coils is misaligned in a coil circling direction.

FIG. 23 shows a configuration in which gaps $g_a$ and $g_b$ between open ends (terminals) of the coil segments 56A and 56B forming the primary coil which are connected to the switching network 64 are misaligned without being overlapped with each other in the coil circling direction. In this configuration, as illustrated, the other end (right end) of the inner coil segment 56A and one end (left end) of the outer coil segment 56B are overlapped with each other in the coil circling direction (positioned on the same line N passing the coil center). The gap $g_a$ of the inner coil segment 56A is positioned at the left side of the line N, and the gap $g_b$ of the outer coil segment 56B is positioned at the right side of the line N.

As such, with the configuration in which the gaps $g_a$ and $g_b$ between open ends (terminals) of the coil segments 56A and 56B forming the primary coil are misaligned in the coil circling direction, the positions of the terminals of the primary coil 54(1) are hardly seen from the plasma and the azimuthal variation in the current density can be reduced.

Figure 24:
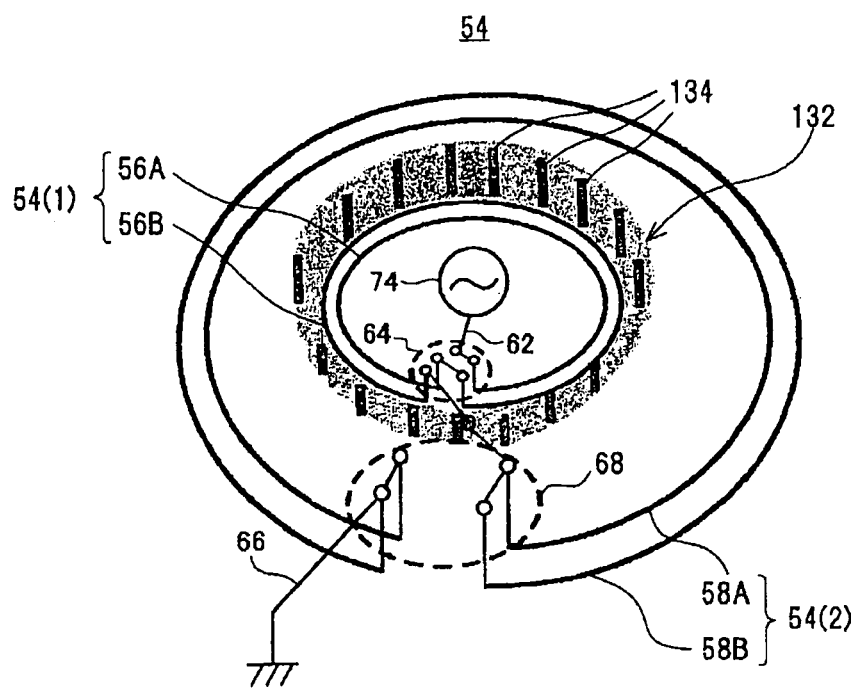
FIG. 24 shows a test example in which a magnetic shield hollow conductor having slits is provided between the central coil and the peripheral coil of the RF antenna.

In the test example of FIG. 24, a conductive plate, e.g., a cylindrical magnetic shield conductor 132 formed of a copper plate, is provided between the central coil 54(1) and the peripheral coil 54(2). The magnetic shield conductor 132 has a plurality of slits 134 extending in the vertical direction and spaced apart from each other at a regular interval in the azimuth direction. Here, it is preferable to vary the slit width of the slits 134 in the azimuth direction.

Figure 25A:
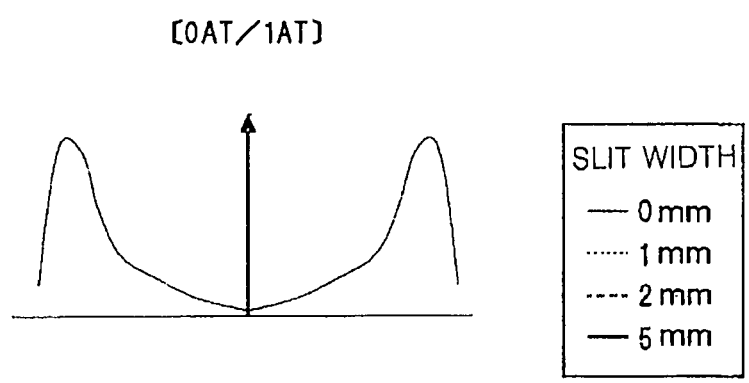
FIGS. 25A to 25C show current density distribution in a doughnut-shaped plasma in each of the combination modes in the case of varying a slit width of the magnetic shield hollow conductor.
Figure 25B:
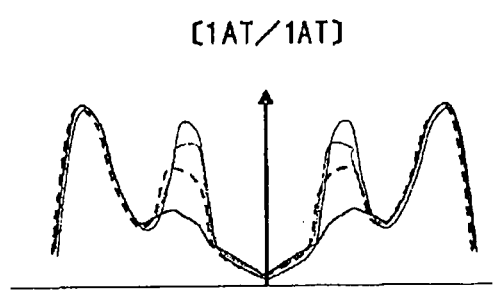
Figure 25C:
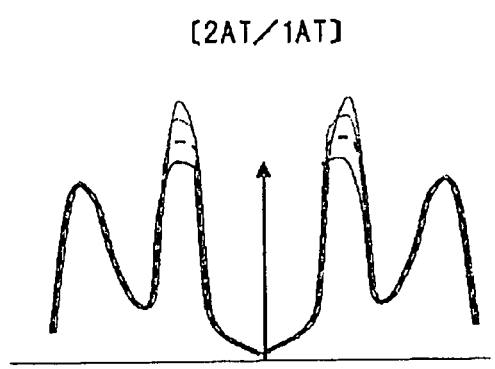

According to the simulation results schematically shown in FIGS. 25A to 25C, the current density distribution in the doughnut-shaped plasma in the region directly below the central coil 54(1) can be finely varied (adjusted) in multiple steps by varying the slit width of the slits 134 from about 0 mm to 5 mm by about 1 mm.

Figure 26:
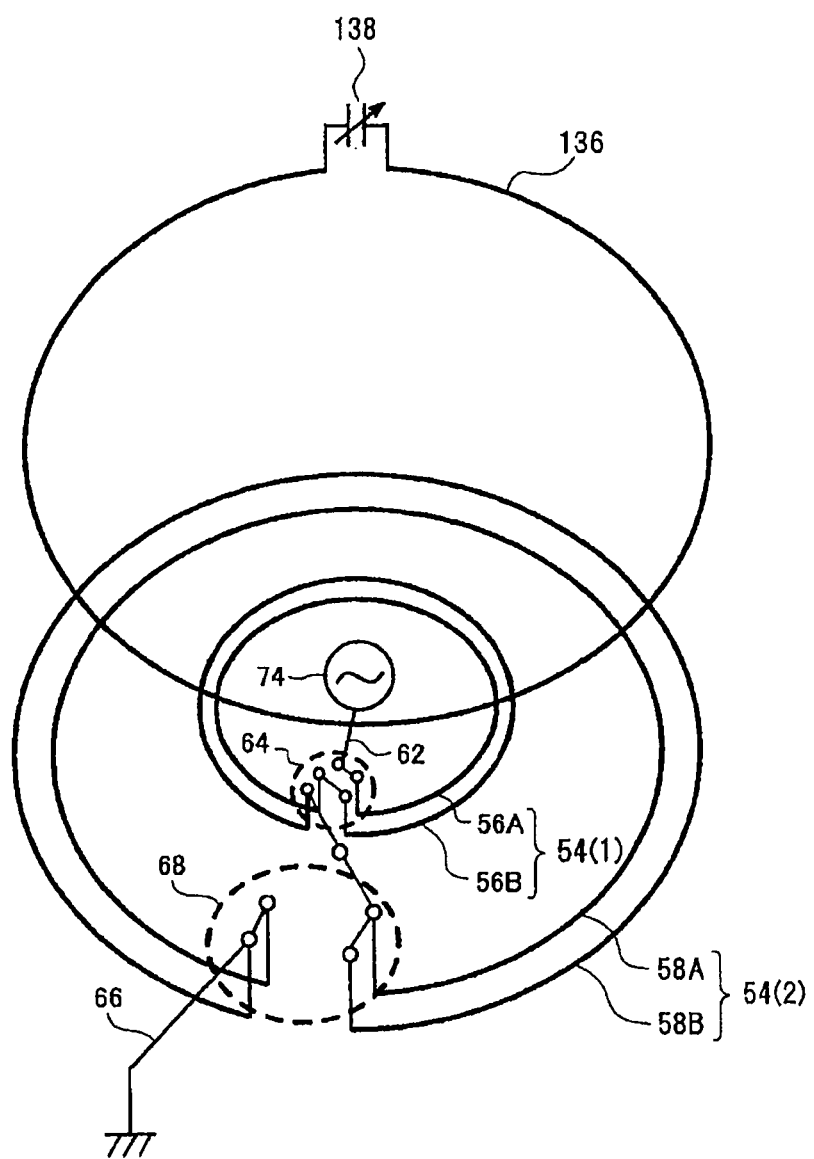
FIG. 26 shows a test example in which a correction coil is provided above an RF antenna.

In the test example shown in FIG. 26, a correction coil 136 is placed above the RF antenna 54 in an electrically floating state. The correction coil 136 is preferably disposed coaxially with respect to the RF antenna 54, and has a desired coil diameter in a radial direction. The coil conductor of the correction coil 136 is preferably made of a metal with high conductivity, e.g., copper plated with silver.

The high frequency AC magnetic field generated around the antenna conductor by the high frequency current flowing through the RF antenna 54 is affected by the reaction of the electromagnetic induction by the correction coil 136. The reaction of the electromagnetic induction is the action against the changes in the magnetic force lines (magnetic flux) penetrating the loop of the correction coil 136. The electromotive force is induced in the correction coil 136, thereby allowing a current to flow in the loop.

Due to the reaction of the electromagnetic induction by the correction coil 136, the radial (horizontal) components of the magnetic flux density in the processing space near the dielectric window 52 are decreased locally at the position directly below the coil conductor of the correction coil 136 (especially, near the intermediate portion between the inner periphery and the outer periphery of the antenna). Hence, the induced electromagnetic field intensity in the azimuth direction as well as the magnetic flux density is decreased locally at the position corresponding to the intermediate portion of the antenna. Therefore, when the diameter of the correction coil 136 is set to be close to that of the central coil 54(1), the current density in the doughnut-shaped plasma near the region directly below the central coil 54(1) can be variably reduced.

In this test example, a capacitor (preferably, a variable capacitor) 138 is preferably provided in the loop of the correction coil 136. By varying the capacitance of the capacitor 138, it is possible to increase or decrease the current density in the doughnut-shaped plasma near the position directly below the correction coil 136. The uniformity of the plasma density distribution near the susceptor 12 can be improved by varying the capacitance of the correction coil 136 by a capacitance varying mechanism in accordance with predetermined processing parameters (e.g., pressure, RF power, gas flow rate and the like) of the processing recipe.

Figure 27:
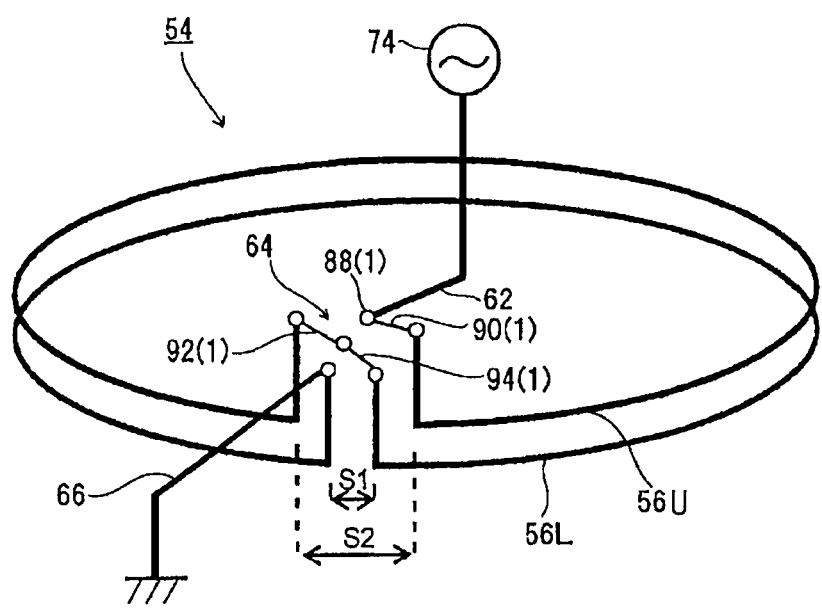
FIG. 27 shows a test example in which a pair of coil segments forming a couple of coils of the RF antenna is vertically overlapped via a gap.
Figure 28A:
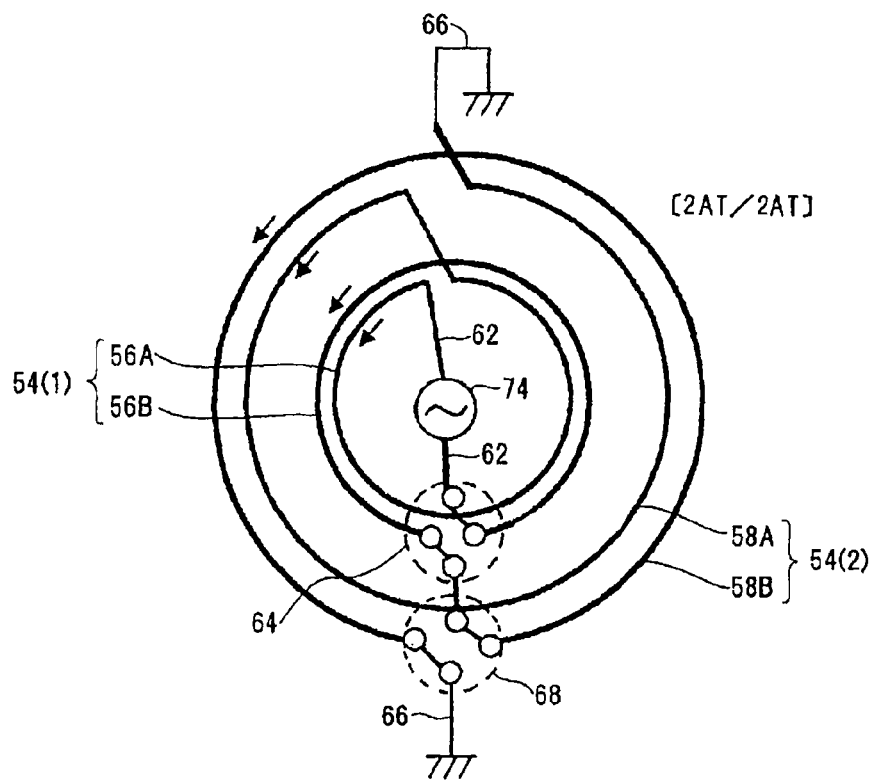
FIG. 28A shows a connection state of each unit in the case of selecting the [2AT/2AT] combination mode in a test example in which a switching network of an RF antenna is simplified.
Figure 28B:
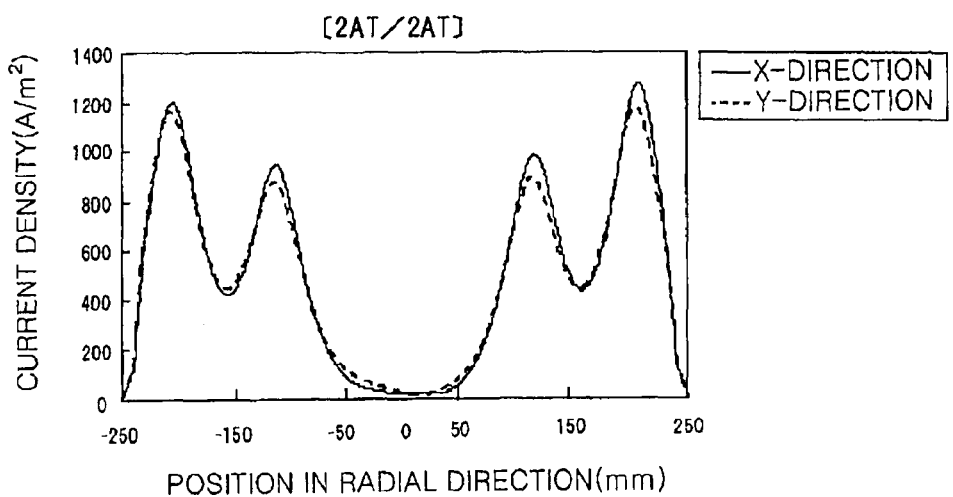
FIG. 28B shows current density distribution in a doughnut-shaped plasma in the case of selecting the [2AT/2AT] combination mode in the test example.
Figure 29A:
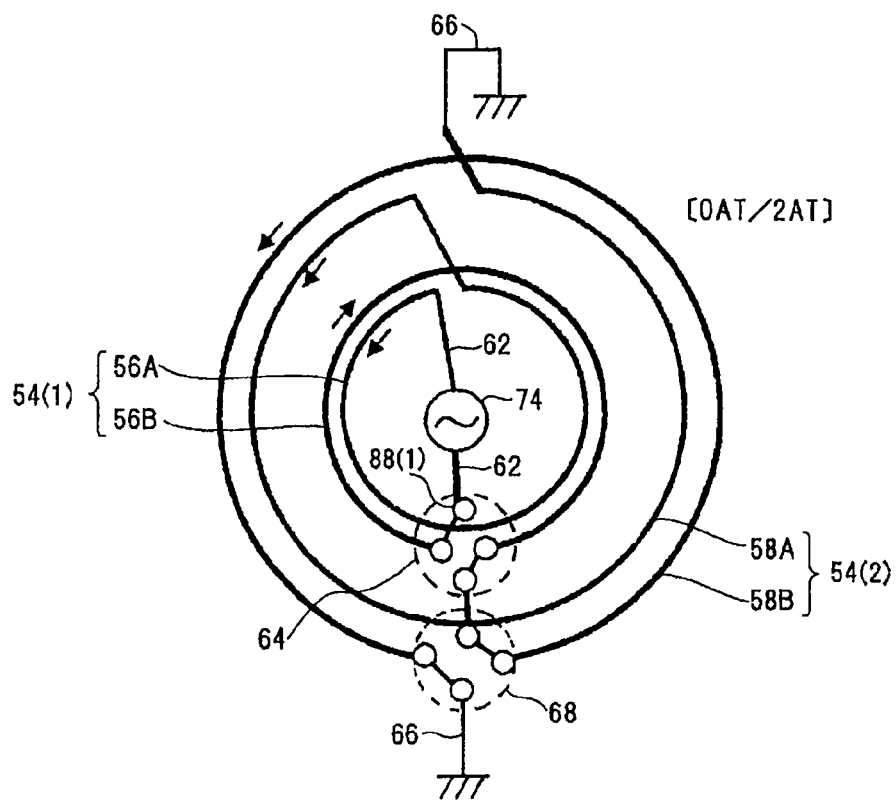
FIG. 29A shows connection state of each unit in the case of selecting a [0AT/0AT] combination mode in a test example in which a switching network of an RF antenna is simplified.
Figure 29B:
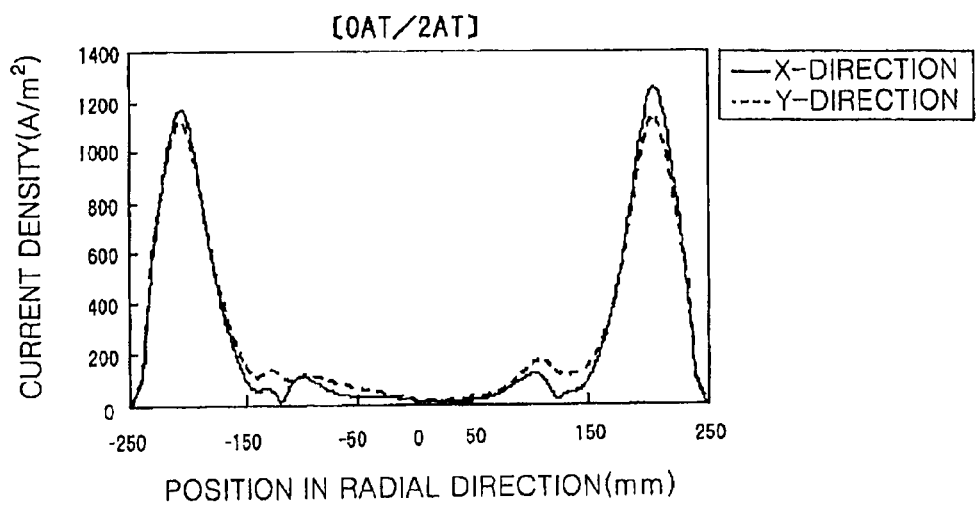
FIG. 29B shows current density distribution in a doughnut-shaped plasma in the case of selecting the [0AT/0AT] combination mode in the test example.

The test example of FIG. 27 shows a configuration in which coil segments 56U and 56L forming a couple of coils are vertically overlapped with a gap therebetween. In that case, the electrical connection (wiring) between both ends of the lower coil segment 56L and the switching network 64 can be easily achieved by setting a gap $S_1$ between the terminals of the lower coil segment 56L to be smaller than a gap $S_2$ between the terminals of the upper coil segment 56U.

In the test examples shown in FIGS. 28A, 28B, 29A and 29B, the parallel mode [1AT] can not be selected for the central coil 54(1) and the peripheral coil 54(2), whereas the multiplication series mode [2AT] or the minimization series mode [0AT] can be selected for the central coil 54(1) and the peripheral coil 54(2). Although the degree of freedom of adjustment is decreased, the number of switches used in the switching networks 64 and 68 can be reduced.

The configuration of the inductively coupled plasma etching apparatus described in the above embodiment is only an example. Therefore, the configurations of the units of the plasma generation mechanism and the configurations of the units which do not distribute to the plasma generation can be variously modified.

For example, the RF antenna may have a dome shape or the like other than a planar shape. Moreover, a chamber structure for rectangular target substrate, a rectangular RF antenna structure and a rectangular correction structure can be employed.

Further, the processing gas may be introduced from the processing gas supply unit into the chamber 10 via the ceiling portion, and the high frequency power $RF_L$ for DC bias control may not be applied to the susceptor 12.

The inductively coupled plasma processing apparatus and the plasma processing method therefor of the present invention can be applied to other plasma processing such as plasma CVD, plasma oxidation, plasma nitriding, sputtering and the like other than plasma etching. Further, the target substrate of the present invention is not limited to a semiconductor wafer, and may be various substrates for a FPD (Flat Panel Display), a photomask, a CD substrate, a printed circuit board or the like.

What is claimed is:

1. A plasma processing apparatus comprising:
   a vacuum evacuable processing chamber, at least a portion of which is formed of a dielectric window;
   a substrate supporting unit for supporting a target substrate in the processing chamber;
   a processing gas supply unit for supplying a desired processing gas into the processing chamber to perform a desired plasma process on the substrate;
   an RF antenna, including a first and a second coil segment extending in parallel to each other, provided outside the dielectric window to generate a plasma of the processing gas in the processing chamber by inductive coupling;
   a high frequency power supply unit for supplying to the RF antenna a high frequency power having a frequency suitable for high frequency discharge of the processing gas; and
   a switching network switched among a parallel mode in which the first and the second coil segment are connected in parallel in the RF antenna, a multiplication series mode in which the first and the second coil segment are connected in series such that a direction of a current flowing through the first coil segment and a direction of a current flowing through the second coil segment are the same in a coil circling direction, and a minimization series mode in which the first and the second coil segment are connected in series such that a direction of a current flowing through the first coil segment and a direction of a current flowing through the second coil segment are opposite to each other in the coil circling direction.

2. The plasma processing apparatus of claim 1, wherein the first and the second coil segment extend in parallel to each other with a predetermined gap therebetween.

3. The plasma processing apparatus of claim 1, wherein the switching network includes:
   a first switch for switching a terminal connected or connectable to a high frequency power supply line from the high frequency power supply unit between a position connected to one end of the first coil segment and a position connected to the other end of the first coil segment;
   a second switch for switching the other end of the first coil segment among a position connected to one end of the second coil segment, a position connected to the other end of the second coil segment and a position disconnected from the one end and the other end of the second coil segment; and
   a third switch for switching the one end of the second coil segment between a position connected to the one end of the first coil segment and the other end of the first coil segment.

4. The plasma processing apparatus of claim 3, wherein a third coil segment is connected between the high frequency power supply line from the high frequency power supply unit and the terminal.

5. The plasma processing apparatus of claim 3, wherein a fourth coil segment is connected between the other end of the second coil segment and an additional terminal connected or connectable to a ground potential member electrically maintained at a ground potential.

6. The plasma processing apparatus of claim 3, wherein a capacitor is connected between the other end of the second coil segment and an additional terminal connected or connectable to a ground potential member electrically maintained at a ground potential.

7. The plasma processing apparatus of claim 1, wherein the switching network includes:
   a first switch for switching a terminal connected or connectable to a ground potential member electrically maintained at a ground potential between a position connected to one end of the second coil segment and a position connected to the other end of the second coil segment;
   a second switch for switching the other end of the second coil segment among a position connected to the one end of the first coil segment, a position connected to the other end of the first coil segment and a position disconnected from the one end and the other end of the first coil segment; and
   a third switch for switching the one end of the first coil segment between a position connected to the one end of the second coil segment and a position connected to the other end of the second coil segment.

8. The plasma processing apparatus of claim 3, wherein a capacitor is connected between the other end of the first coil segment and the one end of the second coil segment via the second and the third switch.

9. The plasma processing apparatus of claim 1, wherein in a coil circling direction, one end and the other end of the first coil segment are close to each other, and one end and the other end of the second coil segment are close to each other.

10. The plasma processing apparatus of claim 1, wherein in a direction perpendicular to the coil circling direction, one ends of the first and the second coil segment are close to each other, and the other ends of the first and the second coil segment are close to each other.

11. The plasma processing apparatus of claim 1, wherein the first and the second coil segment are disposed coaxially in parallel to the dielectric window, and a ratio of an diameter of an inner coil segment to a diameter of a outer coil segment is greater than or equal to about 80%.

12. The plasma processing apparatus of claim 1, wherein the first and the second coil segment are disposed coaxially in parallel to the dielectric window with a gap smaller than a skin depth therebetween.

13. A plasma processing apparatus comprising:
   a vacuum evacuable processing chamber, at least a portion of which is formed of a dielectric window;
   a substrate supporting unit for supporting a target substrate in the processing chamber;
   a processing gas supply unit for supplying a desired processing gas into the processing chamber to perform a desired plasma process on the substrate;
   an RF antenna, including a first and a second coil segment extending in parallel to each other and a third and a fourth coil segment extending in parallel to each other with larger diameters than diameters of the first and the second coil segment, provided outside the dielectric window to generate a plasma of the processing gas in the processing chamber by inductive coupling;
   a high frequency supply unit for supplying to the RF antenna a high frequency power having a frequency suitable for high frequency discharge of the processing gas;
   a first switching network switched among a first parallel mode in which the first and the second coil segment are connected in parallel in the RF antenna, a first multiplication series mode in which the first and the second coil are connected in series such that a direction of a current flowing through the first coil segment and a direction of a current flowing through the second coil segment are the same in a coil circling direction, and a first minimization series mode in which the first and the second coil segment are connected in series such that a direction of a current flowing through the first coil segment and a direction of a current flowing through the second coil segment are opposite to each other in the coil circling direction; and
   a second switching network switched among a second parallel mode in which the third and the fourth coil segment are connected in parallel in the RF antenna, a second multiplication series mode in which the third and the fourth coil are connected in series such that a direction of a current flowing through the third coil segment and a direction of a current flowing through the fourth coil segment are the same in a coil circling direction, and a second minimization series mode in which the third and the fourth coil segment are connected in series such that a direction of a current flowing through the third coil segment and a direction of a current flowing through the fourth coil segment are opposite to each other in the coil circling direction.

14. The plasma processing apparatus of claim 13, wherein in the coil circling direction, one end and the other end of the first coil segment are close to each other; one end and the other end of the second coil segment are close to each other; one end and the other end of the third coil segment are close to each other; and one end and the other end of the fourth coil segment are close to each other.

15. The plasma processing apparatus of claim 13, wherein in a direction perpendicular to the coil circling direction, one ends of the first and the second coil segment are close to each other; the other ends of the first and the second coil segment are close to each other; one ends of the third and the fourth coil segment are close to each other; and the other ends of the third and the fourth coil segment are close to each other.

16. The plasma processing apparatus of claim 13, wherein the first and the second coil segment are disposed coaxially in parallel to the dielectric window, and a ratio of a diameter of an inner coil segment thereof to a diameter of an outer coil segment thereof is greater than or equal to about 80%, and wherein the third and the fourth coil segment are disposed coaxially in parallel to the dielectric window, and a ratio of a diameter of an inner coil segment thereof to a diameter of an outer coil segment thereof is greater than or equal to about 80%.

17. The plasma processing apparatus of claim 13, wherein the first and the second coil segment are disposed coaxially in parallel to the dielectric window with a gap smaller than a skin depth therebetween, and the third and the fourth coil segment are disposed coaxially in parallel to the dielectric window with a gap smaller than a skin depth therebetween.

18. A plasma processing apparatus comprising:
a vacuum evacuable processing chamber, at least a portion of which is formed of a dielectric window;
a substrate supporting unit for supporting a target substrate in the processing chamber;
a processing gas supply unit for supplying a desired processing gas into the processing chamber to perform a desired plasma process on the substrate;
an RF antenna, including a first and a second arc-shaped coil segment extending in parallel to each other and a third and a fourth arc-shaped coil segment extending in parallel to each other respectively along the circumferences of the first and the second coil segment, provided outside the dielectric window to generate a plasma of the processing gas in the processing chamber by inductive coupling;
a high frequency power supply unit for supplying to the RF antenna a high frequency power having a frequency suitable for high frequency discharge of the processing gas; and
a switching network switched among a parallel mode in which the first and the second coil segment are connected in parallel and the third and the fourth coil segment are connected in parallel in the RF antenna, a multiplication series mode in which the first and the third coil segment are connected in series and the second and the fourth coil segment are connected in series such that a direction of a current flowing through the first coil segment and a direction of a current flowing through the second coil segment are the same in a coil circling direction, and a direction of a current flowing through the third coil segment and a direction of a current flowing through the fourth coil segment are the same in the coil circling direction, and a minimization series mode in which the first and the second coil segment are connected in series and the third and the fourth coil segment are connected in series such that a direction of a current flowing through the first coil segment and a direction of a current flowing through the second coil segment are the opposite in the coil circling direction and a direction of a current flowing through the third coil segment and a direction of a current flowing through the fourth coil segment are opposite to each other in the coil circling direction.

19. The plasma processing apparatus of claim 18, wherein the switching network includes:
a first switch for switching a terminal connected or connectable to a high frequency power supply line from the high frequency power supply unit between a position connected to one end of the first coil segment and a position connected to one end of the third coil segment;
a second switch for switching the one end of the third coil segment among a position connected to one end of the fourth coil segment, a position connected to one end of the second coil segment, and a position disconnected from the one end of the fourth coil segment and the one end of the second coil segment;
a third switch for switching the one end of the second coil segment between a position connected to the one end of the first coil segment and a position connected to the one end of the third coil segment;
a fourth switch for switching the terminal between a position connected to the other end of the first coil segment and a position connected to the other end of the third coil segment;
a fifth switch for switching the other end of the first coil segment among a position connected to the other end of the fourth coil segment, a position connected to the other end of the second coil segment, and a position disconnected from the other end of the fourth segment and the other end of the second coil segment; and
a sixth switch for switching the other end of the fourth coil segment between a position connected to the other end of the third coil segment and the other end of the first coil segment.

20. The plasma processing apparatus of claim 18, wherein the switching network includes:
a first switch for switching a terminal connected or connectable to a ground potential member electrically maintained at a ground potential between a position connected to one end of the second coil segment and a position connected to one end of the fourth coil segment;
a second switch for switching one end of the first coil segment among a position connected to the one end of the second coil segment, a position connected to the one end of the fourth coil segment, and a position disconnected from the one end of the second coil segment and the one end of the fourth coil segment;
a third switch for switching one end of the third coil segment between a position connected to the one end of the second coil segment and a position connected to the one end of the fourth coil segment;
a fourth switch for switching the terminal between a position connected to the other end of the second coil segment and a position connected to the other end of the fourth coil segment;
a fifth switch for switching the other end of the third coil segment among a position connected to the other end of the fourth coil segment, a position connected to the other end of the second coil segment, and a position disconnected from the other end of the fourth coil segment and the other end of the second coil segment; and
a sixth switch for switching the other end of the first coil segment between a position connected to the other end of the second coil segment and a position connected to the other end of the fourth coil segment.

21. The plasma processing apparatus of claim 18, wherein in the coil circling direction, one ends of the first and the third coil segment are close to each other; the other ends of the first and the third coil segment are close to each other; one ends of the second and the fourth coil segment are close to each other; and the other ends of the second and the fourth coil segment are close to each other.

22. The plasma processing apparatus of claim 18, wherein in a direction perpendicular to the coil circling direction, one ends of the first and the second coil segment are close to each other; the other ends of the first and the second coil segment are close to each other; one ends of the third and the fourth coil segment are close to each other; and the other ends of the third and the fourth coil segment are close to each other.

23. The plasma processing apparatus of claim 18, wherein the first and the second coil segment are disposed coaxially in parallel to the dielectric window, and a ratio of a radius of an inner coil segment thereof to a radius of an outer coil segment thereof is greater than or equal to about 80%, and wherein the third and the fourth coil segment are disposed coaxially in parallel to the dielectric window, and a ratio of a radius of an inner coil segment thereof to a radius of an outer coil segment thereof is greater than or equal to about 80%.

24. The plasma processing apparatus of claim 18, wherein the first and the second coil segment are disposed coaxially in parallel to the dielectric window with a gap smaller than a skin depth therebetween, and the third and the fourth coil segment are disposed coaxially in parallel to the dielectric window with a gap smaller than a skin depth therebetween.

25. A plasma processing method comprising:
disposing a target substrate at a predetermined position below a dielectric window provided at a ceiling portion of a vacuum evacuable processing chamber;
supplying a desired processing gas from a processing gas supply unit into the processing chamber;
maintaining a pressure in the processing chamber at a predetermined depressurized state;
selecting one among a parallel mode in which a first and a second coil segment extending in parallel to each other are connected in parallel in an RF antenna disposed above the dielectric window, a multiplication series mode in which the first and the second coil segment are connected in series such that a direction of a current flowing through the first coil segment and a direction of a current flowing through the second coil segment are the same in a coil circling direction, and a minimization series mode in which the first and the second coil segment are connected in series such that a direction of a current flowing through the first coil segment and a direction of a current flowing through the second coil segment are opposite to each other in the coil circling direction;
allowing a high frequency current to flow through the first and the second coil segment connected in accordance with the selected mode by applying a high frequency power having a predetermined frequency from a high frequency power supply to the RF antenna;
generating a plasma of the processing gas near the dielectric window in the processing chamber by an induced electric field and a magnetic field of a high frequency in accordance with the high frequency current flowing through the first and the second coil segment;
diffusing the generated plasma in the processing chamber; and
performing a desired plasma process on the substrate by using the plasma.

26. A plasma processing method comprising:
disposing a target substrate at a predetermined position below a dielectric window provided at a ceiling portion of a vacuum evacuable processing chamber;
supplying a desired processing gas from a processing gas supply unit into the processing chamber;
maintaining a pressure in the processing chamber to a predetermined depressurized state;
selecting one among a parallel mode in which a first and a second arc-shaped coil segment extending in parallel to each other are connected in parallel and a third and a fourth arc-shaped coil segment extending in parallel to each other are connected in parallel in an RF antenna disposed above the dielectric window, a multiplication series mode in which the first and the third coil segment are connected in series and the second and the fourth coil segment are connected in series such that a direction of a current flowing through the first coil segment and a direction of a current flowing through the second coil segment are the same in a coil circling direction and a direction of a current flowing through the third coil segment and a direction of a current flowing through the fourth coil segment are the same in the coil circling direction, and a minimization series mode in which the first and the second coil segment are connected in series and the third and the fourth coil segment are connected in series such that a direction of a current flowing through the first coil segment and a direction of a current flowing through the second coil segment are the opposite in the coil circling direction and a direction of a current flowing through the third coil segment and a direction of a current flowing through the fourth coil segment are opposite to each other in the coil circling direction;
allowing a high frequency current to flow through the first to the fourth coil segment connected in accordance with the selected mode by applying a high frequency power having a predetermined high frequency from a high frequency power supply to the RF antenna;
generating a plasma of the processing gas near the dielectric window in the processing chamber by an induced electric field and a magnetic field of a high frequency in accordance with the high frequency current flowing through the first to the fourth coil segment;
diffusing the generated plasma in the processing chamber; and
performing a desired plasma process on the substrate by using the plasma.

* * * * *